United States Patent [19]
Hada et al.

[11] Patent Number: 4,589,139
[45] Date of Patent: May 13, 1986

[54] APPARATUS FOR DETECTING DEFECTS IN PATTERN

[75] Inventors: Kazunari Hada, Kawasaki; Norio Fujii, Urawa; Toru Azuma, Tokyo; Kaoru Kikuchi, Yokohama; Junji Hazama, Kawasaki, all of Japan

[73] Assignee: Nippon Kogaku K. K., Tokyo, Japan

[21] Appl. No.: 462,515

[22] Filed: Jan. 31, 1983

[30] Foreign Application Priority Data

Feb. 4, 1982 [JP] Japan .................. 57-15463
May 18, 1982 [JP] Japan .................. 57-82355

[51] Int. Cl.⁴ .................................. G06K 9/46
[52] U.S. Cl. ............................ 382/8; 358/107; 382/25
[58] Field of Search ............... 382/8, 25, 48; 358/101, 358/107

[56] References Cited

U.S. PATENT DOCUMENTS

| | | | |
|---|---|---|---|
| 4,014,000 | 3/1977 | Uno et al. | 382/25 |
| 4,021,778 | 5/1977 | Ueda et al. | 382/25 |
| 4,300,122 | 11/1981 | McMahon | 382/8 |
| 4,442,542 | 4/1984 | Lin et al. | 382/25 |
| 4,450,579 | 5/1984 | Nakashima et al. | 382/25 |

Primary Examiner—Leo H. Boudreau
Attorney, Agent, or Firm—Shapiro and Shapiro

[57] ABSTRACT

An apparatus for inspecting a pattern consisting of light and dark areas formed on a planar test specimen according to design information, comprising: an imaging device for viewing the pattern to generate image information; a detector for generating a first signal upon detection that, in response to the image information, a boundary line between the light and dark areas of the pattern is bent in a determined stepping form in the direction of the plane; a memory for generating and storing a second signal, upon detection that the boundary line of the pattern has a bend of stepping form according to the design information, corresponding to the position in the imaging area of the bend in the design information; and an inspecting device for discriminating, upon generation of the first signal, the presence or absence of the second signal in the memory corresponding to the position of the first signal in the image area.

10 Claims, 53 Drawing Figures

FIG. 16
FIG. 17
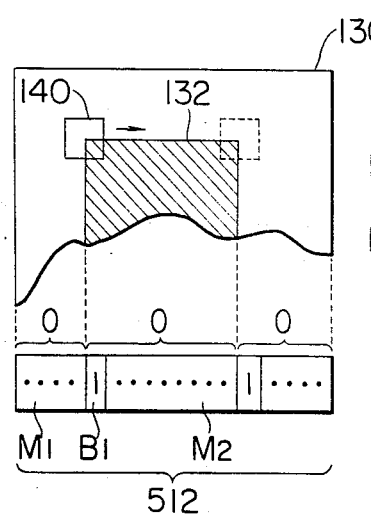
FIG. 18
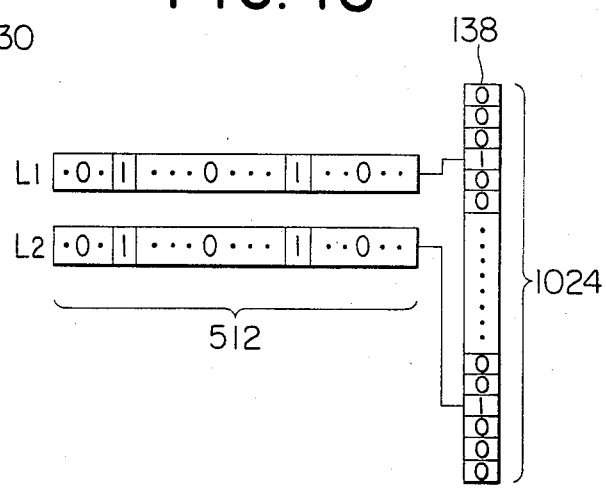

FIG. 27
|   | x 1 | 2 | 3 | 4 | 5 | 6 | 7 | 8 | 9 | 10 |
|---|---|---|---|---|---|---|---|---|---|---|
| y 1 | · | · | · | · | · | · | · | · | · | · |
| 2 | · | · | · | · | · | · | · | · | · | · |
| 3 | · | · | · | · | · | · | · | · | · | · |
| 4 | 0 | 0 | 0 | 1 | 0 | 0 | 0 | 0 | 0 | 0 |
| 5 | · | · | · | · | · | · | · | · | · | · |
| 6 | · | · | · | · | · | · | · | · | · | · |
| 7 | · | · | · | · | · | · | · | · | · | · |
| 8 | 0 | 0 | 0 | 1 | 0 | 0 | 0 | 0 | 0 | 0 |
| 9 | · | · | · | · | · | · | · | · | · | · |
FIG. 28
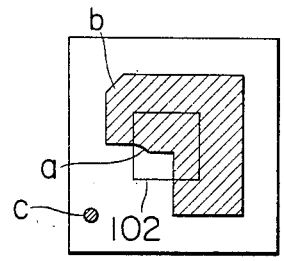
FIG. 29A
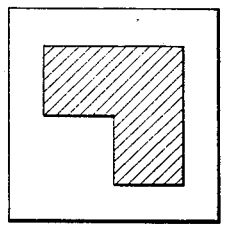
FIG. 29B
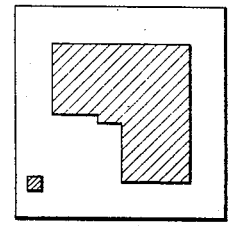

APPARATUS FOR DETECTING DEFECTS IN PATTERN

BACKGROUND OF THE INVENTION

1. Field of the Invention

The present invention relates to an appatatus for inspecting a determined fine pattern formed on a substrate and detecting defects present therein, and more particularly to an apparatus for inspecting whether a pattern transferred on a mask or a reticle in an integrated circuit manufacturing process is correctly formed in comparison with the design data for forming said pattern.

2. Description of the Prior Art

For such purpose there has conventionally been proposed an inspecting method of comparing plural chips of the same pattern formed on the same mask, or a method of developing the design data in an image memory in the form of a bit pattern and comparing said pattern in pixel units with the image data obtained from a pattern on the mask or the reticle. However the former method based on the comparison of chips is unable to locate defects common to all the chips, and is not applicable to the inspection of a reticle pattern used as an original for preparing masks since the reticle usually contains only one pattern. On the other hand the latter method, being based on the comparison with the design data for pattern preparation, is capable of identifying defects common to the chips and is applicable to the inspection of a reticle pattern. However this method requires an image memory of a very large capacity in order to store the design data converted into the form of pixel units, and also requires a long time with a large complicated apparatus.

SUMMARY OF THE INVENTION

In consideration of an foregoing, the object of the present invention is to provide a defect detecting apparatus capable of identifying the presence or absence of defects in the pattern with reference to the design data without the aforementioned drawbacks and without a memory of a large capacity. The apparatus of the present invention is featured by obtaining image information by sensing a geometrical pattern formed on a test specimen according to design information, detecting local features of said image information, and producing a defect signal in case said local features are not present in said design information.

More specifically the apparatus of the present invention comprises scanning means for scanning a geometrical pattern formed on a test specimen according to design information, thereby generating image signals corresponding to said pattern; detecting means adapted for generating detection information in case the pattern in a local area of the test specimen is provided with a determined feature prepared in advance; and comparing said detection information with said design information.

In an embodiment of the present invention said detecting means is adapted to detect an angle of 135° and small irregularities at the edge of the pattern in said local area, set a flag when one of such features is detected and output said detection information corresponding to said flag, and comprises first detecting means for detecting that a boundary line of said pattern forms a bend with determined steps, and second detecting means for detecting an isolated pattern not exceeding a determined size, wherein said second detecting means is adapted to detect an isolated pattern distanced in excess of steps determined by said first detecting means.

BRIEF DESCRIPTION OF THE DRAWINGS

FIG. 16 is a view of a template corresponding to an angle pattern BB shown in FIG. 14;

FIG. 17 is a view showing an example of the frame memory;

FIG. 18 is a view showing the function of a flag memory;

FIG. 27 is a view showing an example of feature information appearing in the reference window;

FIG. 28 is a view showing the window and a reticle pattern appearing in an image frame;

FIG. 29A is a view showing an example of the original pattern corresponding to the design data;

FIG. 29B is a view showing another example of the original pattern;

DESCRIPTION OF THE PREFERRED EMBODIMENTS

Figure 1:
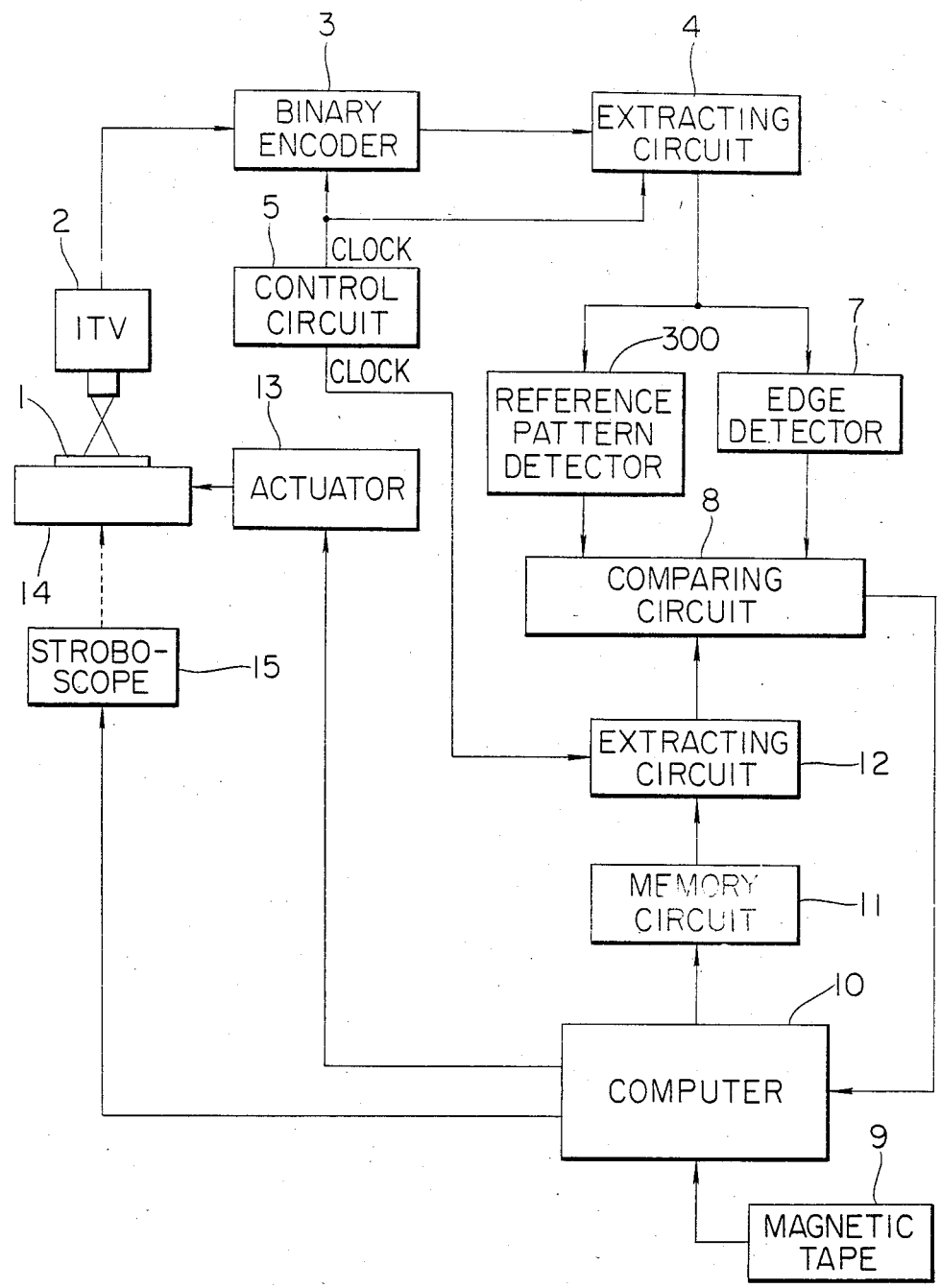
FIG. 1 is a block diagram showing an embodiment of the present invention.

Referring to FIG. 1, a test specimen, represented by a reticle 1 with fine patterns, is placed on a movable stage 14. A determined small area alone on the reticle 1 is imaged by an industrial television device (ITV) 2 and constitutes an image frame to be inspected. The reticle 1 is transmission illuminated by a stroboscope 15. Analog image signals from the ITV device 2 are converted into binary image signals by a binary encoder 3 and subjected to a noise removing process such as smoothing if necessary.

Figure 2:
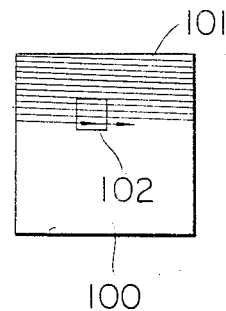
FIG. 2 is a schematic view of an image frame to be inspected.

As shown in FIG. 2, an image frame 100 to be inspected is raster scanned by scanning lines 101 of the ITV device 2. In the present embodiment the image frame 100 is assumed to contain 1024 scanning lines in the vertical direction.

An extracting circuit 4 extracts, from said binary image signals, binary information corresponding to a local area, for example a rectangular area in the image frame to be inspected. Said local rectangular area is for example composed of an area of 16×16 pixels in the image frame.

Since the pattern on the reticle 1 is generally composed of chromium deposited on a glass plate, the analog image signals assume a form of time-sequential signals corresponding to dark and light areas or black and white areas. A control circuit 5 generates 1024 clock pulses per scanning line in the image frame 100, and the binary encoder 3 samples the analog image signals at each clock pulse to generate a binary image signal corresponding to a pixel.

Figure 3:
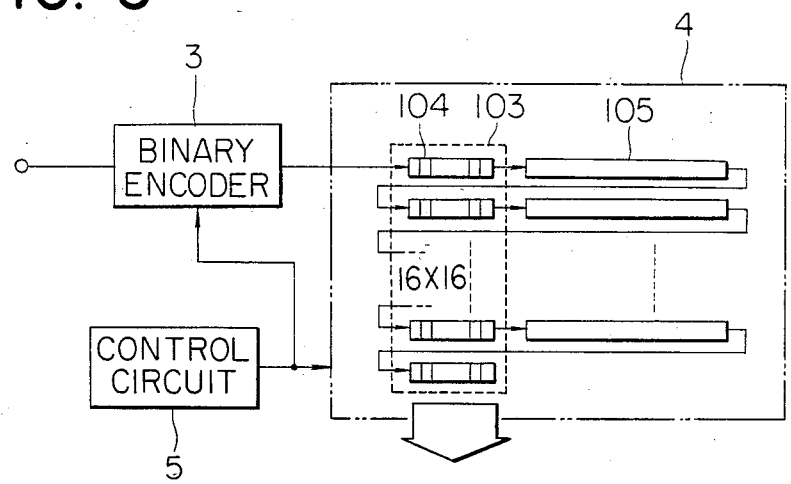
FIG. 3 is a schematic view of an imaging unit of the embodiment shown in FIG. 1.

The extracting circuit 4 is composed, as shown in FIG. 3, of alternate serial connection of 15 shift registers 104 of 16 bits and 15 shift registers 105 of 1024 bits followed by a shift register 104 of 16 bits. The binary image signals are at first entered into the first 16-bit shift register 104 and are transferred in succession in the serial shift registers in synchronization with the clock pulses generated by the control circuit 5. Since the analog image signals of a scanning lines are binary encoded by 1024 samplings, the binary image signals constitute time-sequential signals in which the image 100 is divided into 1024×1024 pixels and each pixel is represented by a logic value "0" or "1". If the image frame 100 is of a size 1×1 mm, a pixel will have a size of 1×1 μm. In response to a sampling in the binary encoder 3, a shift is effected in the serial shift registers to transfer each logic value corresponding to a pixel to a succeeding bit. In the present embodiment the binary encoder 3 samples each scanning line with 1024 clock pulses but effects 16 samplings during a retrace line period, and the extracting circuit 4 is shifted 16 times during said retrace line period. An extracting unit 103 composed of 16 shift registers 104 stores binary image information in a local rectangular area 102 of 16×16 pixels, which will hereinafter be called a window, in the image 100. With the progress of the scanning, the window 102 moves by a pixel at each clock pulse to extract the binary image imformation in succession from the entire area of the image 100. The binary information of 16×16 pixels extracted from said window 102 is supplied to the reference pattern detector 300 and an edge detector 7 shown in FIG. 1. Said reference pattern detector 300 discriminates whether an edge in the window 102 corresponding to a boundary between the light and dark areas of the pattern on the reticle 1 corresponds to one of predetermined continuous bend forms to be explained later or to an isolated light or dark form. The edge detector 7 discriminates the presence of an edge which looks like a corner pattern in the window 102, even when the corner pattern on the reticle 7 is rounded by the influence of the imaging optical system and cannot be recognized as a corner.

Figure 4:
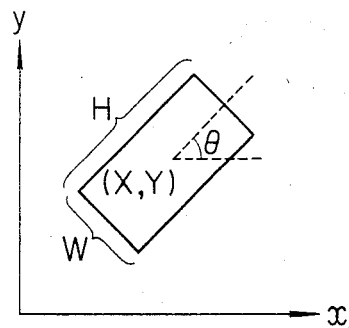
FIG. 4 is a view showing a simplified image pattern.

The design data for the preparation of the reticle 1 stored in a magnetic tape 9 are supplied to a computer 10. As an example, the design data in the magnetic tape 9 contain the entire pattern of the reticle as a group of rectangles as shown in FIG. 4. The actual circuit pattern is composed of a complicated combination of such rectangular patterns. A rectangular pattern is represented by five parameters, i.e. width W, height H, coordinate values (x, y) of the center in a determined x-y coordinate system on the reticle, and rotation angle $\theta$.

Referring to FIG. 1 again, the computer 10 outputs design data corresponding to an image frame on the reticle 1 to be imaged by the ITV device 2. In response to said design data, a memory circuit 11 detects and stores characteristic patterns in the design similar to those detected by the reference pattern detector 300. Also said memory circuit 11 extracts and stores the information on the angle of 90° (an edge bent in 90°), which will hereinafter be called 90° angle information. The reference pattern information and the 90° angle information thus extracted from the design data will be collectively called characteristic information. The memory circuit 11 stores the characteristic information to be present in an image frame, in succession in an order following the movement of the aforementioned window 102. In this manner the memory circuit 11 stores all the information on the pattern edges to be designed in an image frame. The characteristic information of an image frame is stored as frame information in a memory device (not shown) of the computer 10. Prior to said storage, the computer 10 outputs the design data of a succeeding image frame to said memory circuit 11.

The above-mentioned steps of extracting characteristic information from the design data, and of storing characteristic information corresponding to all the image frames on the reticle 1 from the memory circuit 11 into the memory device in the computer 10 are effected prior to the actual comparative inspection.

The actual inspection is started upon accumulation of the characteristic information in the memory device of the computer 10. In this state the computer 10 controls actuator means 13 for two-dimensionally moving a stage 14 for positioning an image frame on the reticle 1 for imaging. Simultaneously the computer 10 transfers, from the memory device thereof, characteristic information of said image frame to the memory circuit 11.

The characteristic information in the memory circuit 11 is sent in succession to the extracting circuit 12, of which the extracting area is selected smaller than the aforementioned window 102. Thus said extracting circuit 12 extracts the characteristic information based on the design data in succession in synchronization with clock pulses from the control circuit 5.

As the window 102 moves in the image frame in response to the clock pulses from the control circuit 5 as explained before, the extracting area of the extracting circuit 12, which will be hereinafter called a reference window, and the window 102 move in the same direction in synchronization with said clock pulses.

A comparator circuit 8 constitutes inspecting means in combination with the extracting circuit 12, and, in response to the characteristic pattern information released by the reference pattern detector 300, the detection data obtained from the edge detector 7 and the information from the extracting circuit 12, said comparator circuit 8 releases defect information to the computer 10 in case the actual pattern on the reticle is different from the pattern based on the design data. More specifically, in case the detector 300 detects characteristic patterns, absence of defects is identified if the information from the reference window contains at least a similar characteristic pattern information. Also in case 90° angle information is positioned at the center of the reference window, absence of defects is identified if the edge detector 7 detects an edge which looks like a corner pattern or a simple linear edge in the window 102.

In this manner the comparator circuit 8 compares the information detected by the detector 300 and by the edge detector 7 with the characteristic information stored in the memory circuit 11 and supplies the defect information on real-time basis to the computer 10. The inspection for the entire reticle is completed by repeating the above-explained procedure for the entire area of the reticle.

Now there will be given a detailed explanation of the detector 300. In general, an integrated circuit (IC) pattern is composed of a combination of a large number of rectangular patterns as shown in FIG. 4.

Also the IC pattern is generally constructed in such a manner that the rotation angle θ of each rectangular pattern is equal to 0°, 45°, 90° or 135° to the x-y coordinate system on the reticle, and other rotation angles appear quite seldom. For this reason for a design pattern or a reticle pattern composed of such rectangular patterns, a linear edge in the aforementioned window 102 is assumed to be either horizontal (0°), or vertical (90°) or diagonal (45°, 135°), and edges forming a bent angle are assumed to be in directions of 90° (270°) and 135° (225°).

Figures 5A, 5B:
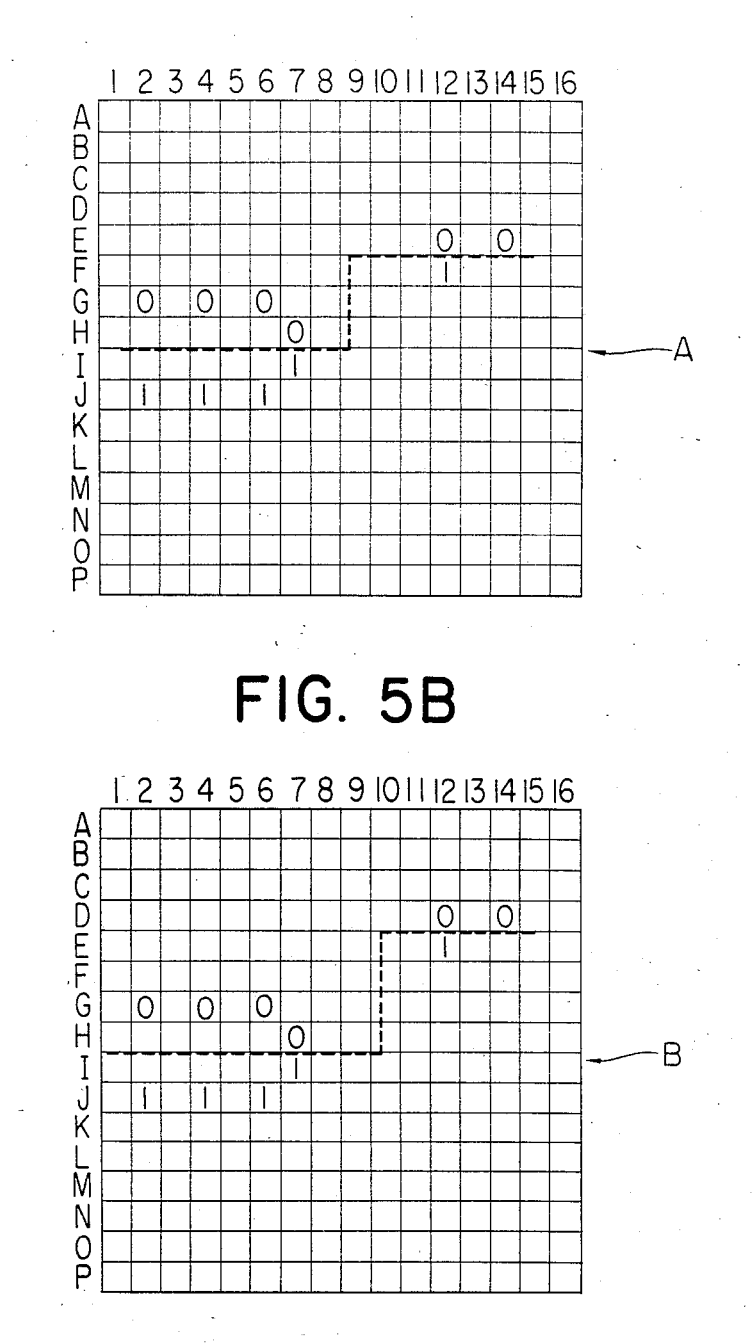
Figures 5C, 5D:
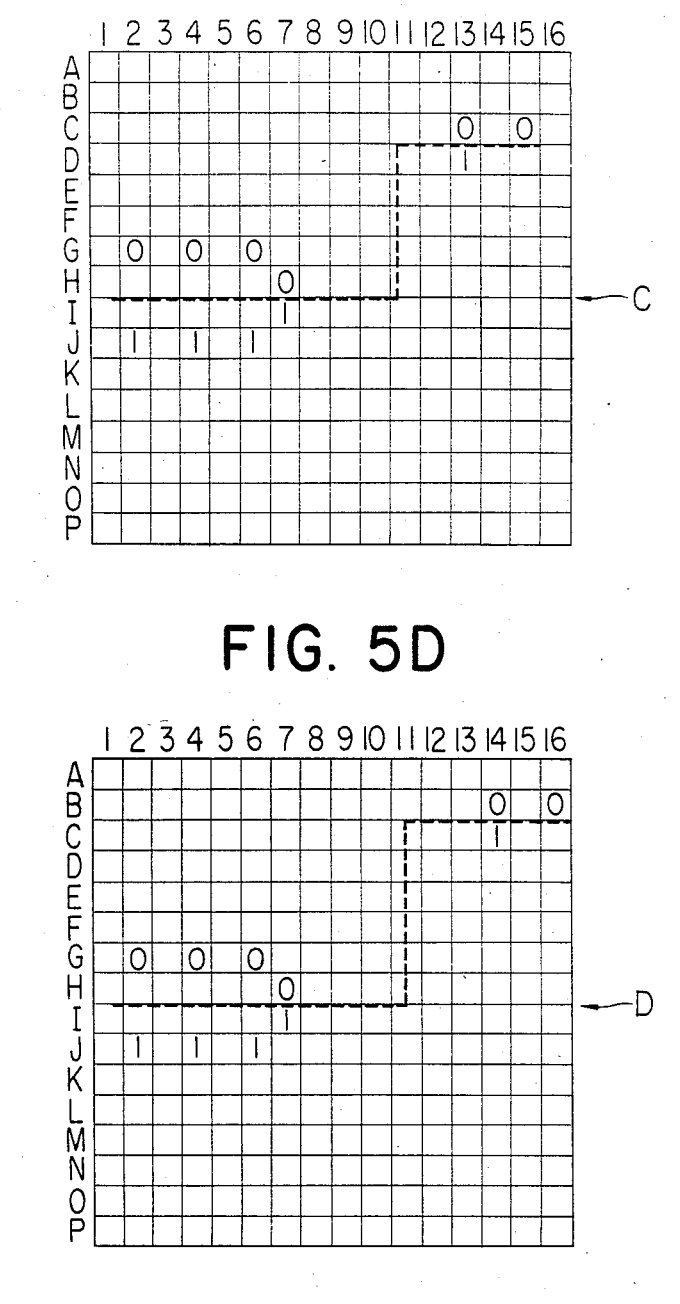
Figures 5E, 5F:
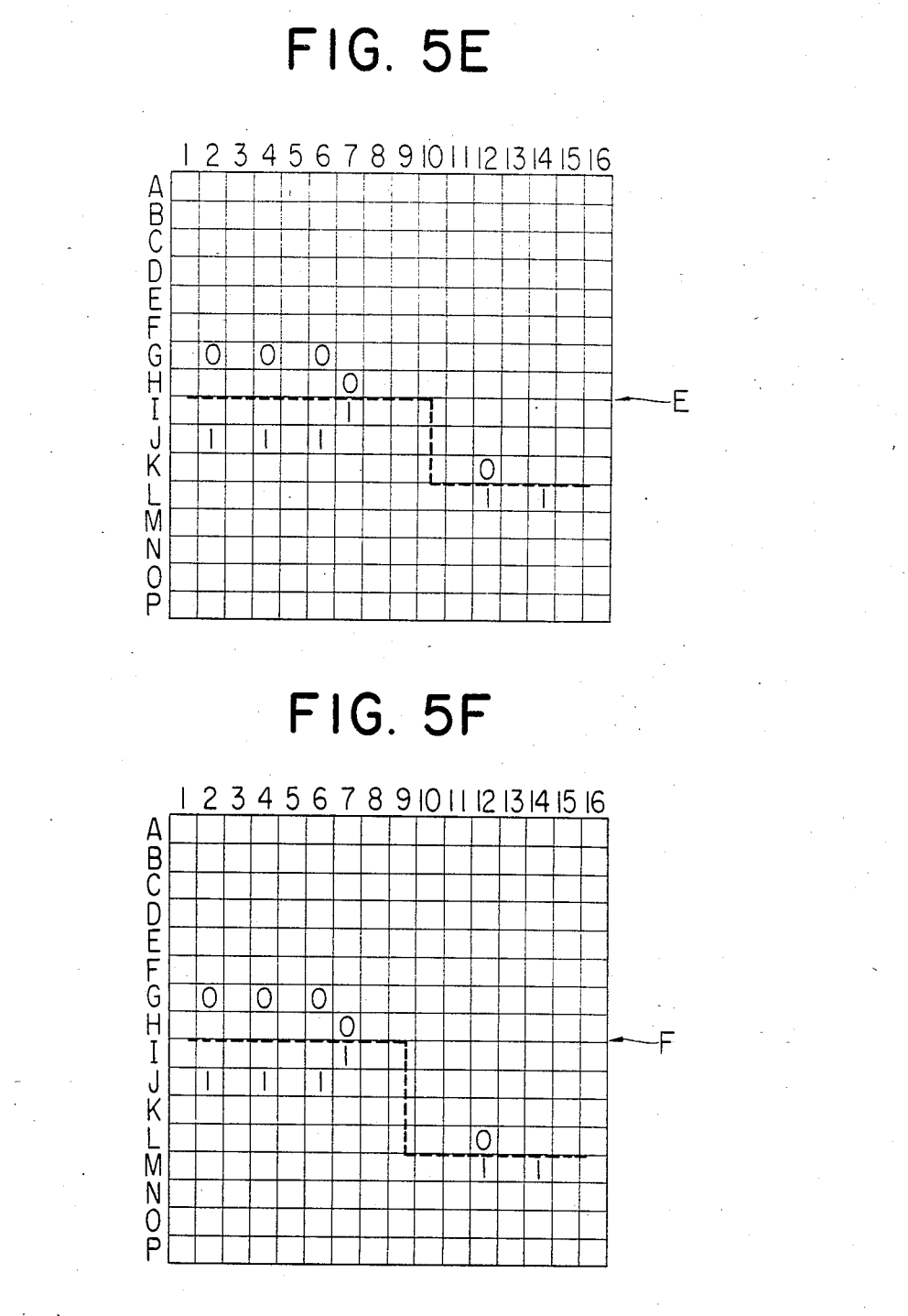
Figures 5G, 5H:
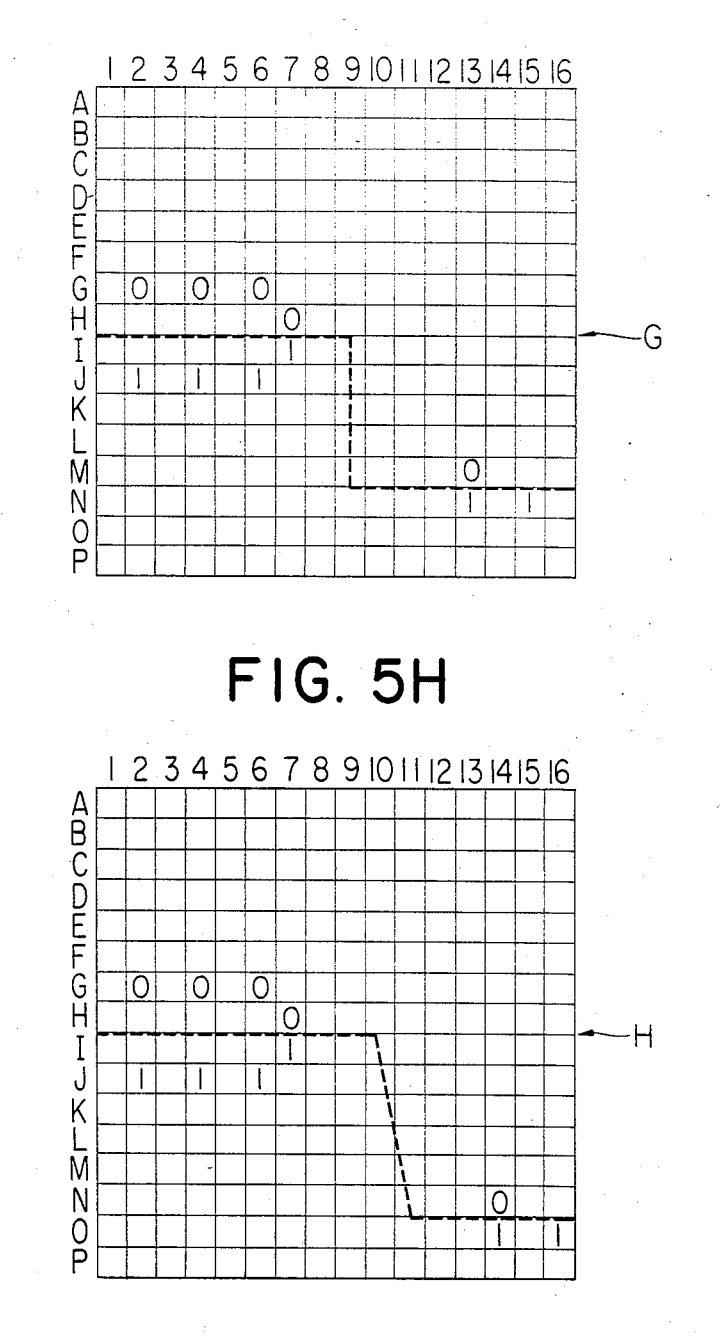
Figure 5I:
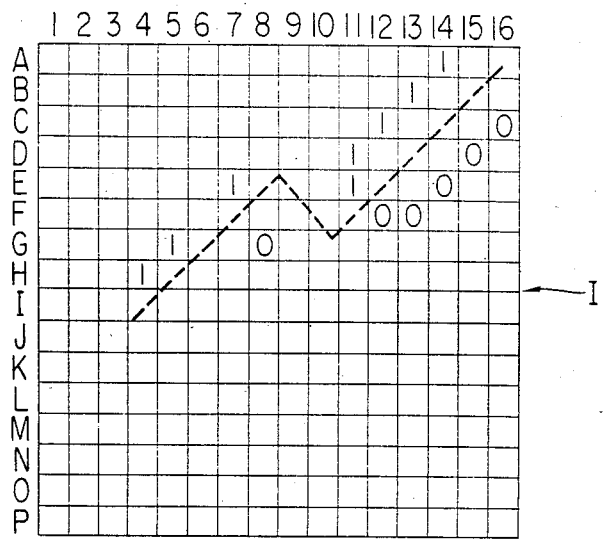
FIGS. 5A–5V are views of templates corresponding to characteristic patterns to be employed in the embodiment of the present invention.
Figure 5J:
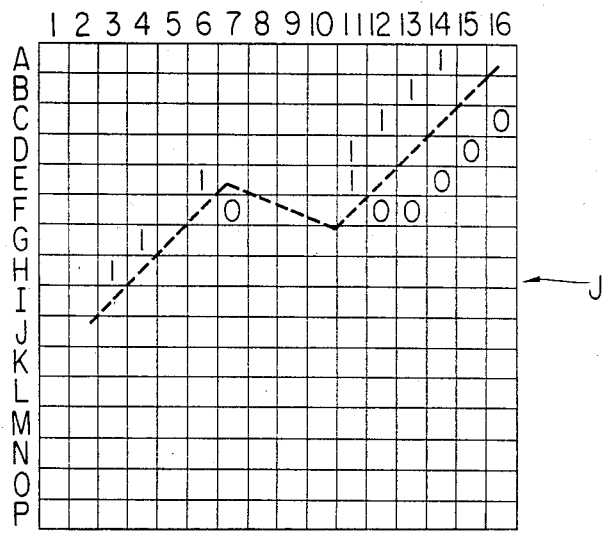
Figure 5K:
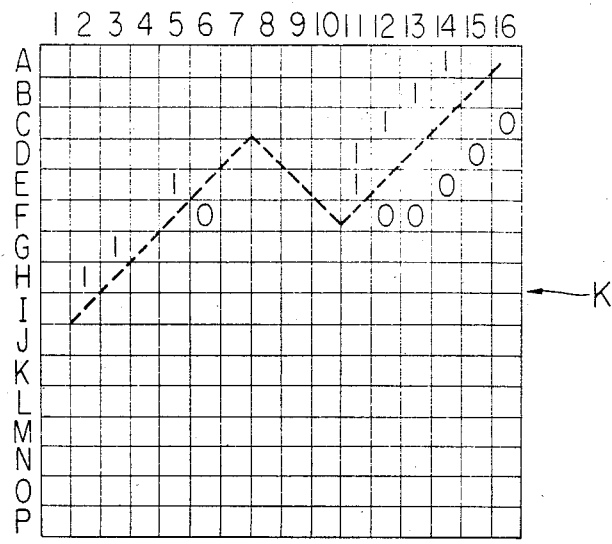
Figure 5L:
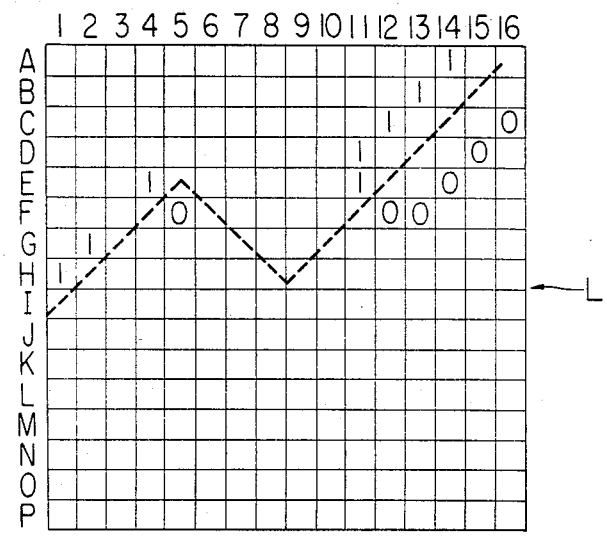
Figure 5M:
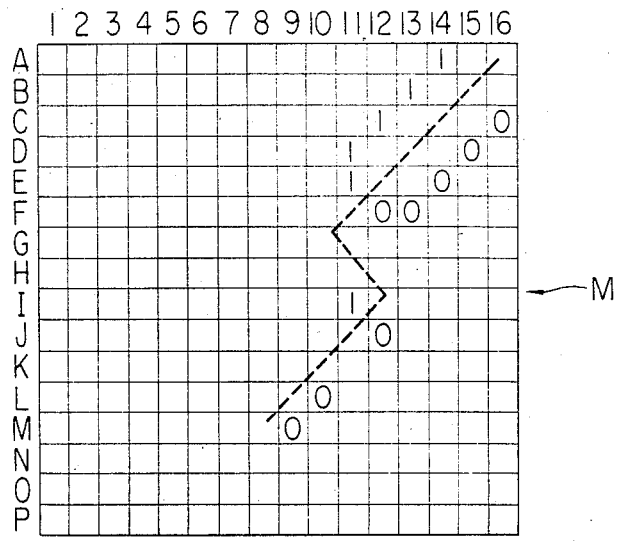
Figure 5N:
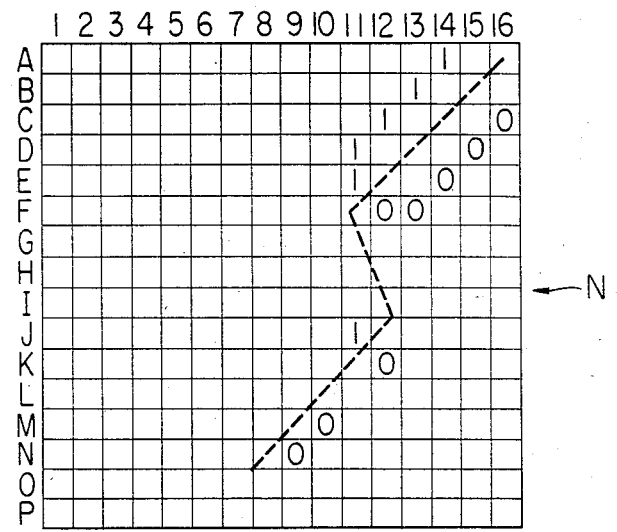
Figure 5O:
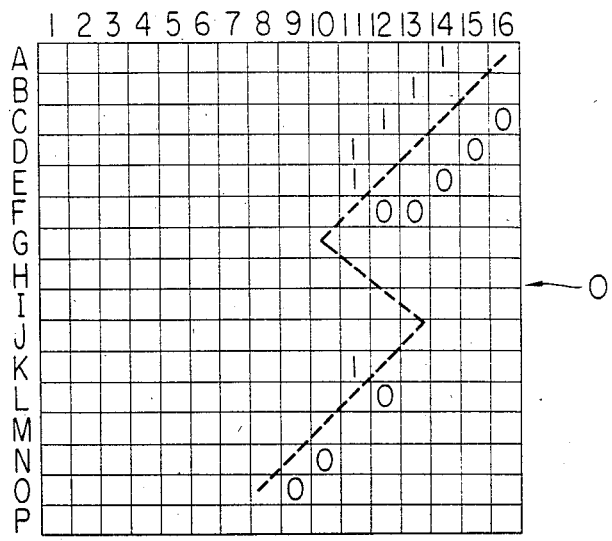
Figure 5P:
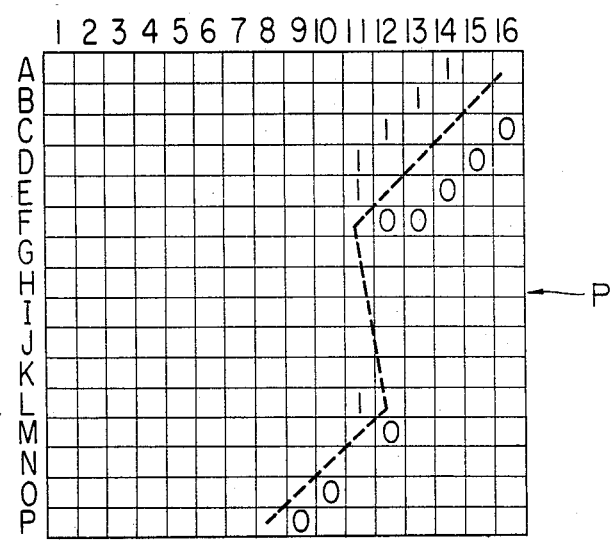
Figure 5Q:
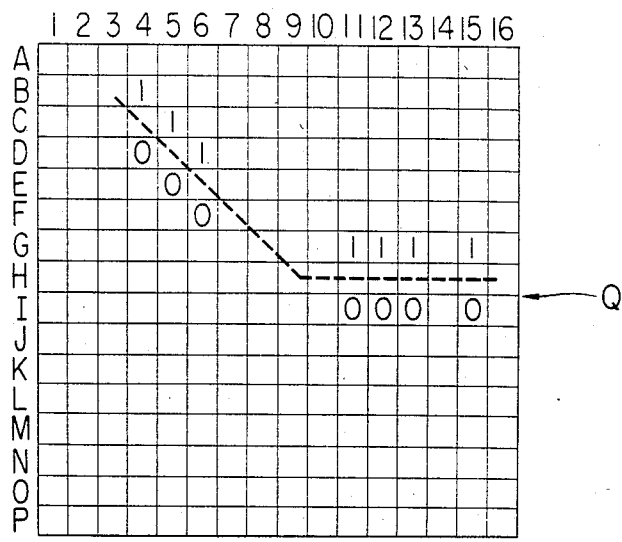
Figure 5R:
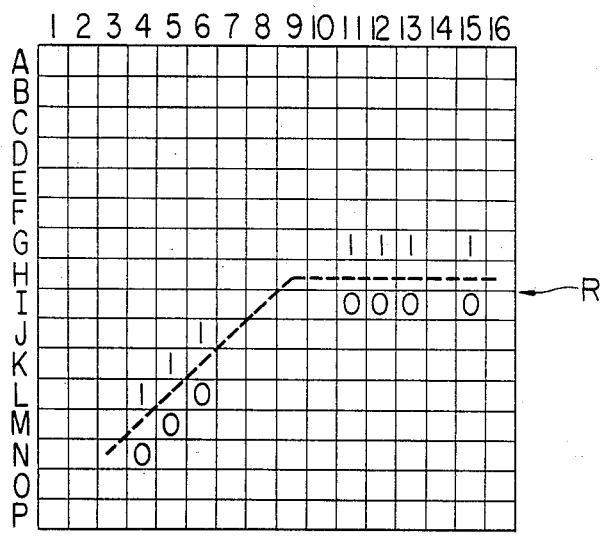

The characteristic patterns employed in the present enbodiment can be represented by templates shown in FIGS. 5A to 5V. A matrix in each figure indicates an area corresponding to the window 102 of 16×16 bits extracted by the extracting circuit 4. In order to specify each bit position in said matrix there are employed two-dimensional value (x, y), wherein x represents horizontal rows A–P and y represents vertical columns 1–16. A logic values "1" in each bit position in said matrix corresponds to a chromium plated or dark area on the reticle while a logic value "0" corresponds to a glass area or a light area. There are considered 164 characteristic patterns, consisting of 80 patterns obtained from 20 patterns shown in FIGS. 5A–5T and from rotations of 90°, 180° and 270° of said 20 patterns, another 80 patterns obtained by inverting logic values (black and white) of the above-mentioned 80 patterns, 2 patterns shown in FIGS. 5U and 5V, and another 2 patterns obtained by inverting the above-mentioned 2 patterns. The detector 300 is provided with templates corresponding to said 164 reference patterns and performs the comparison with the pattern appearing in the window 2.

As an example, the logic calculation for the template A is conducted in the following manner, wherein the logic value of each bit is represented by f(x, y):

$$FG(A) = \overline{f(G, 2)} \cdot \overline{f(G, 4)} \cdot \overline{f(G, 6)} \cdot \overline{f(H, 7)} \cdot f(J, 2) \cdot \qquad (1)$$

$$f(J, 4) \cdot f(J, 6) \cdot f(I, 7) \cdot \overline{f(E, 12)} \cdot \overline{f(E, 14)} \cdot f(F, 12)$$

in which "." stands for a logic product.

Also the logic calculation for the template U is conducted as follows:

$$FG(U) = f(A, 3) \cdot f(A, 4) \cdot f(A, 5) \cdot f(A, 6) \cdot f(A, 7) \cdot f(A, 8) \cdot \qquad (2)$$

$$f(A, 9) \cdot f(A, 10) \cdot f(A, 11) \cdot f(A, 12) \cdot f(A, 13) \cdot f(A, 14) \cdot f(A, 15) \cdot$$

$$f(B, 2) \cdot f(B, 16) \cdot f(C, 2) \cdot f(C, 16) \cdot f(D, 2) \cdot f(D, 16) \cdot f(E, 2) \cdot$$

$$f(E, 16) \cdot f(F, 2) \cdot f(F, 16) \cdot f(G, 2) \cdot f(G, 16) \cdot f(H, 2) \cdot f(H, 16) \cdot$$

$$f(I, 2) \cdot f(I, 16) \cdot f(J, 2) \cdot f(J, 16) \cdot f(K, 2) \cdot f(K, 16) \cdot f(L, 2) \cdot$$

$$f(L, 16) \cdot f(M, 2) \cdot f(M, 16) \cdot f(N, 2) \cdot f(N, 16) \cdot f(O, 3) \cdot f(O, 4) \cdot$$

$$f(O, 5) \cdot f(O, 6) \cdot f(O, 7) \cdot f(O, 8) \cdot f(O, 9) \cdot f(O, 10) \cdot f(O, 11) \cdot$$

$$f(O, 13) \cdot f(O, 14) \cdot f(O, 15) \cdot \{ \overline{f(E, 9)} + \overline{f(F, 8)} + \overline{f(F, 9)} +$$

$$\overline{f(F, 10)} + \overline{f(G, 7)} + \overline{f(G, 8)} + \overline{f(G, 9)} + \overline{f(G, 10)} +$$

$$\overline{f(G, 11)} + \overline{f(H, 6)} + \overline{f(H, 7)} + \overline{f(H, 8)} + \overline{f(H, 9)} +$$

$$\overline{f(H, 10)} + \overline{f(H, 11)} + \overline{f(H, 12)} + \overline{f(I, 7)} + \overline{f(I, 8)} +$$

$$\overline{f(I, 9)} + \overline{f(I, 10)} + \overline{f(I, 11)} + \overline{f(J, 8)} + \overline{f(J, 9)} +$$

$$\overline{f(J, 10)} + \overline{f(K, 9)} \}$$

wherein "+" stands for a logic sum.

Figure 5S:
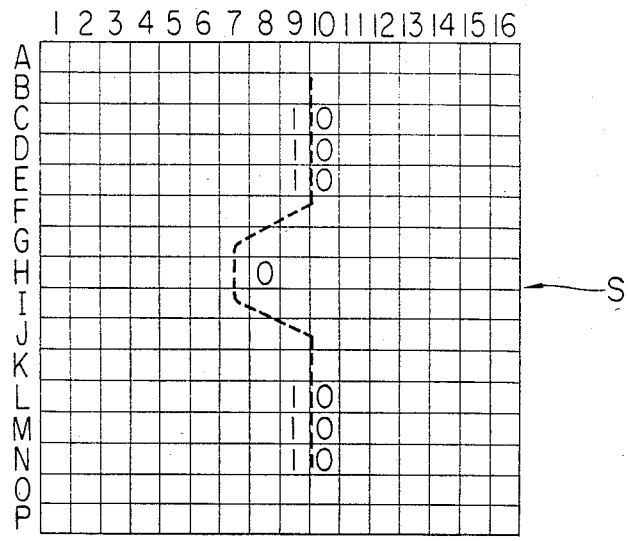
Figure 5T:
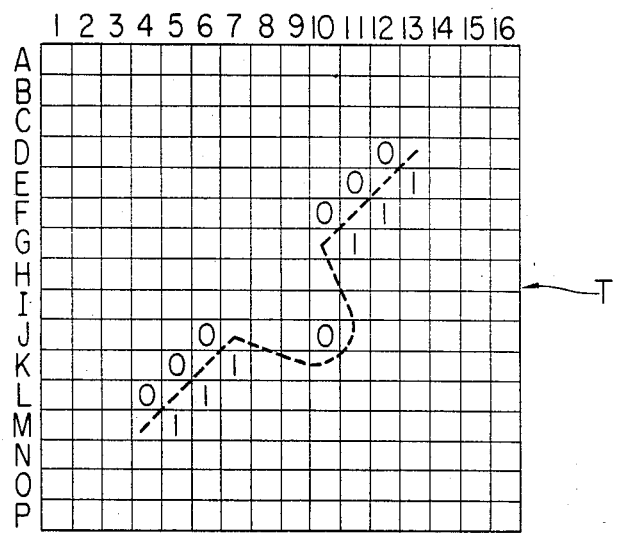
Figures 5U, 5V:
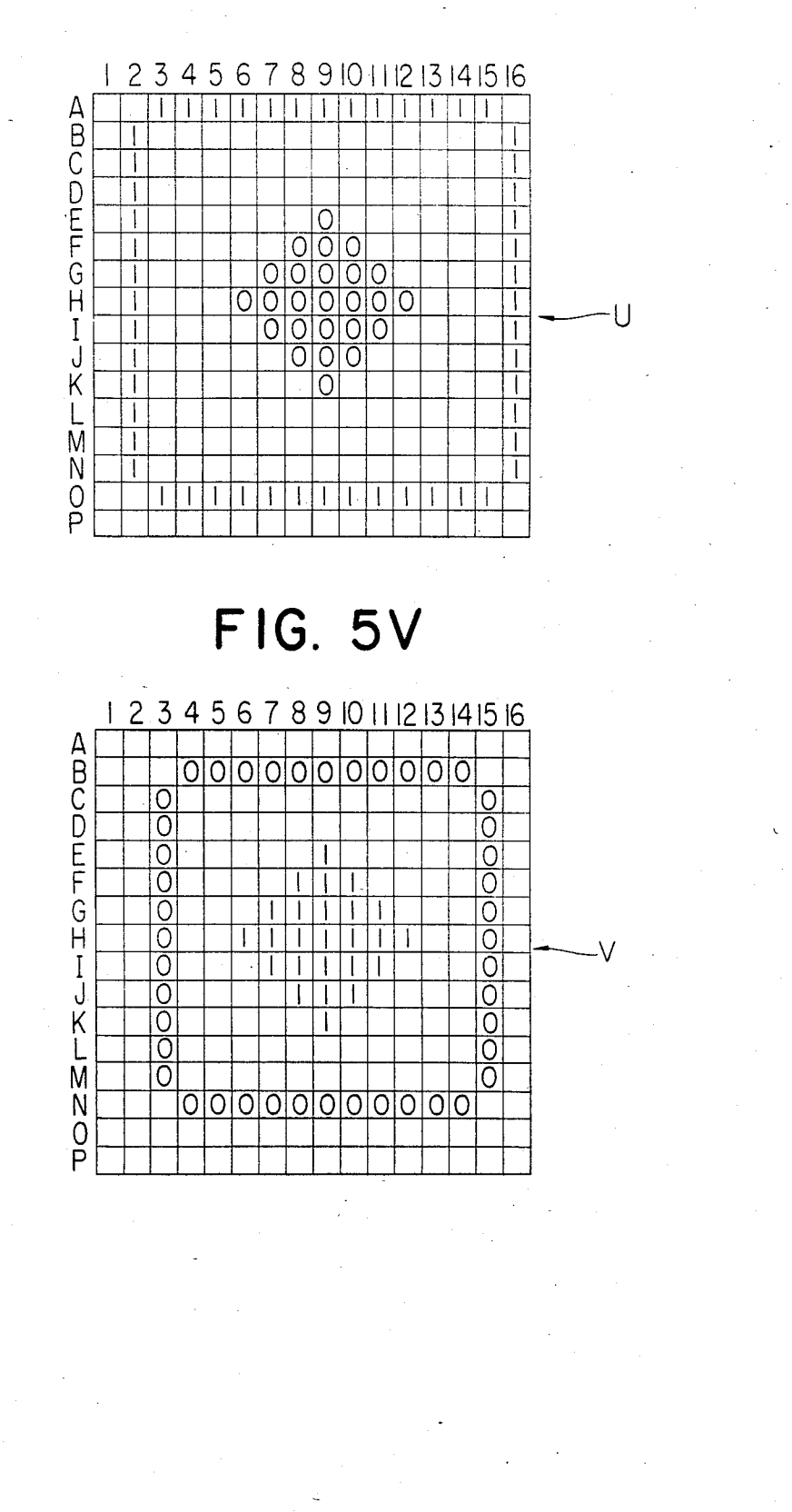

In FIGS. 5A–5T, broken lines in each matrix indicate an example of the edge pattern detectable with such templates. The functions of said templates are as follows. 8 templates A–H detect a horizontal edge showing a stepping difference of 3–6 pixels to a reference horizontal edge passing between bits (H, 7) and (I, 7) in the 16×16 matrix. Other templates I–P detect a diagonal edge showing a stepping difference of 2–4 pixels to a reference diagonal edge passing between bits (E, 11) and (F, 12) with an angle of 45° or 135° in said 16×16 matrix.

Another 2 templates Q, R detect an edge bent with an angle of 135°. The template S detects the presence of a small flexion of 2 pixels or more within a width not exceeding 5 pixels on a reference vertical edge. The template T detects the presence of a small flexion of about 2 pixels or more within a width not exceeding about 5 pixels in a reference diagonal edge. Also the templates U, V detect an isolated pattern.

Figure 6:
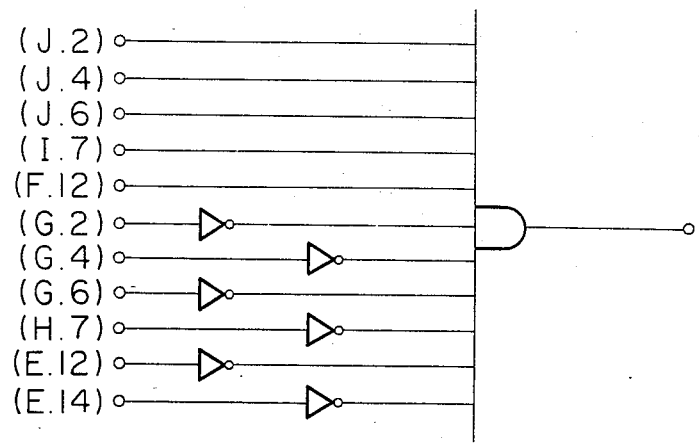
FIG. 6 is a circuit digram showing an AND gate circuit.

The templates A–P detect the presence of an edge with a stepping difference of a determined number of pixels but generally disregard the change in the edge form in the stepping portion. As an example, in case of the template A, the bits (H, 7) and (I, 7) defining the reference horizontal edge and the bits (E, 12) and (F, 12) defining the horizontal edge with the stepping difference may be connected with various edges. The template A can detect not only a vertical connecting edge as indicated by the broken line but also a diagonal connecting edge. Each of 160 templates obtained from the templates A–T is formed by an AND gate circuit. As an example, the template A is composed, according to the aforementioned logic equation (1), of an AND gate circuit with 11 input ports as shown in FIG. 6. Among said 11 ports, five are connected to the bits (J, 2), (J, 4), (J, 6), (I, 7) and (F, 12) of the aforementioned extracting unit 103 of 16×16 bits, while the remaining six input ports are connected, respectively through inverters, to the bits (G, 2), (G, 4), (G, 6), (G, 7), (E, 12) and (E, 14).

Consequently said AND gate circuit outputs a signal "1" only when an edge pattern as shown by the broken lines in FIG. 5A appears in the window 102 corresponding to the extracting unit 103.

Figure 7:
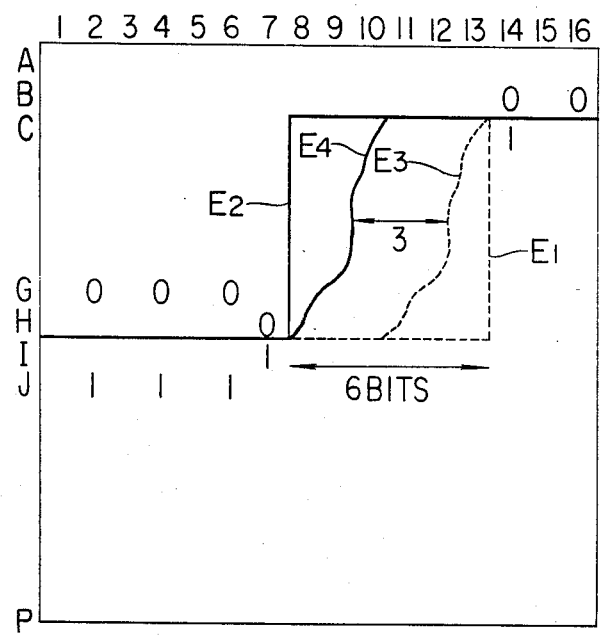
FIG. 7 is a view showing the relationship between a horizontal edge and the template shown in FIG. 5D.

Since the window is displaced by one pixel at a time horizontally in the image frame in response to each clock pulse, a horizontal edge pattern with a stepping difference appearing in the window 102 may continue to generate the signal "1" from the AND gate over several clock pulses. As an example, a horizontal edge with a stepping difference of 6 pixels present in the pattern of the reticle 1 is detected by the template D as shown in FIG. 7. In case the horizontal edges showing said stepping difference are connected by a vertical edge, the AND gate constituting said template D continues to generate the signal "1" over 6 clock pulses during which said vertical edge moves over a distance of 6 pixels from E1 to E6. Also in case said horizontal edges are connected by a curved edge or a diagonal edge, the AND gate continues to generate the signal "1" while said edge moves over a distance of 3 pixels from E3 to E4.

In this manner, in the template D, it is defined that two horizontal edges are mutually separated by the horizontal distance between the paired bits (H, 7), (I, 7) and the paired bits (B, 14), (C, 14), i.e. by 6 pixels.

In each of the templates A–P, there always exist two pairs of bits separating the ends of two edges by a determined number of pixels, and such will be called defining bit pairs.

In templates for detecting the stepping difference in horizontal edges, each defining bit pair is composed of vertically neighboring two bits, so that the detection by the template is no longer possible when the window 102 is vertically displaced by one pixel in the scanning. Also in templates for detecting the stepping difference between vertical edges, obtained by rotating the templates A–H by 90° or 270°, in which each defining bit pair is composed of horizontally adjoining two bits, the detection is possible only in one position of the window 102 in the horizontal direction but over several pixels in the vertical direction. In templates I–P and those obtained by rotation of 90°, 180° or 270° thereof, each defining bit pair is composed of diagonally neighboring bits.

Figure 8:
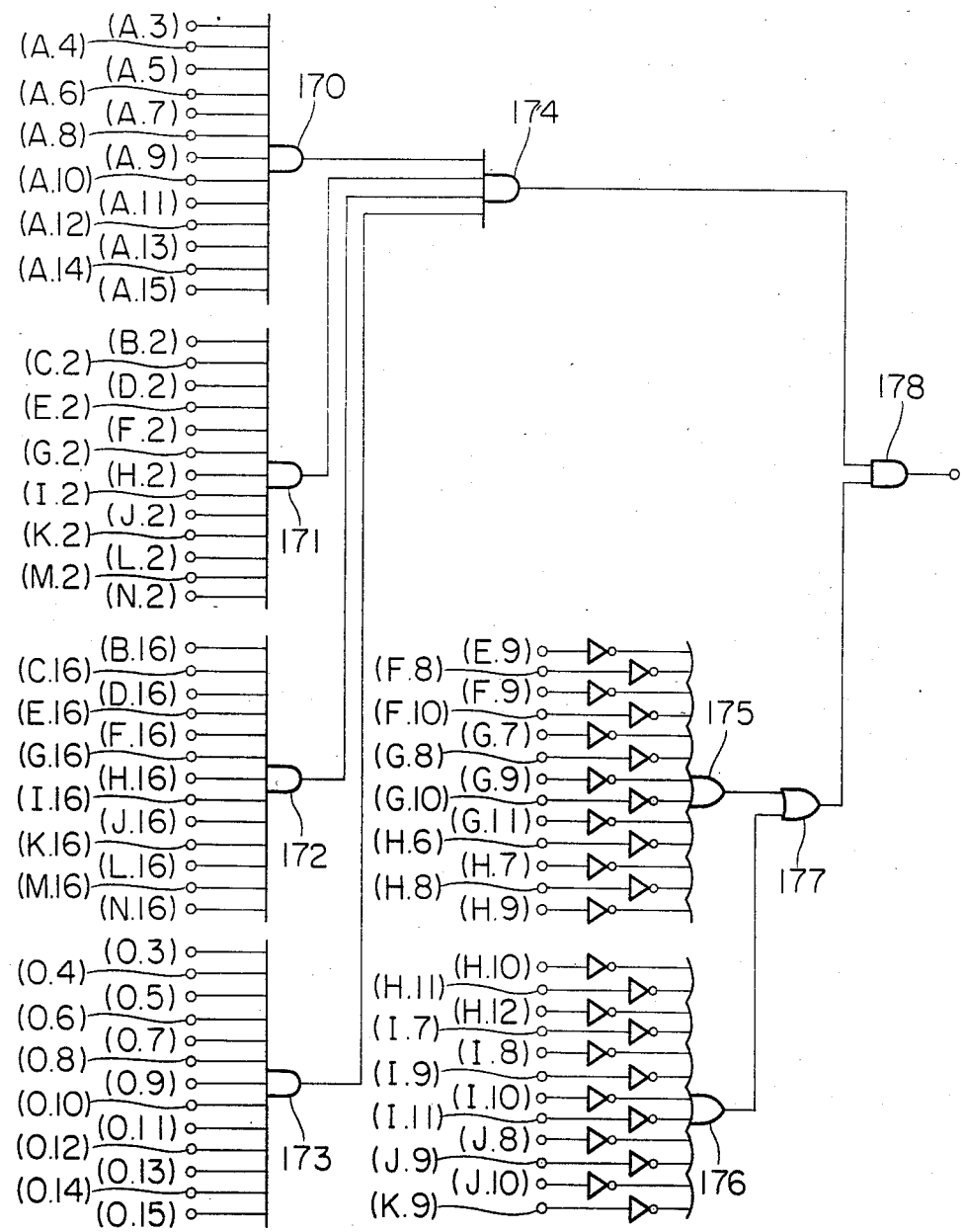
FIG. 8 is a detailed circuit diagram corresponding to the template shown in FIG. 5U.

The template U, for detecting a white pattern isolated in a black background, is composed of a circuit shown in FIG. 8, corresponding to the logic equation (2). Said circuit is constructed in such a manner as to output a signal "1" when all the pixels "1" constituting an external area coincide with the black pattern and at least one of the pixels "0" constituting an internal area coincides with the white isolated pattern.

Consequently the template U can detect an isolated pattern smaller than a square of 13×13 pixels, the minimum detectable pattern being a single pixel.

In the template U of 16×16 bits, as shown in FIG. 8, the uppermost horizontal row of 13 bits from (A, 3) to (A, 15) are connected to an AND gate 170, and the vertical column of 13 bits at left from (B, 2) to (N, 2) are connected to an AND gate 171. Similarly the vertical column of 13 bits at right from (B, 16) to (N, 16) are connected to an AND gate 172, and the lowermost horizontal row of 13 bits from (O, 3) to (O, 15) are connected to an AND gate 173. The outputs of said AND gates 170–173 are connected to an AND gate 174.

In a rectangular area at the center of the template U, bits (E, 9), (F, 8), (F, 9), (F, 10), (G, 7), (G, 8), (G, 9), (G, 10), (G, 11), (H, 6), (H, 7), (H, 8) and (H, 9) are connected respectively through inverters to an OR gate 175, and bits (H, 10), (H, 11), (H, 12), (I, 7), (I, 8), (I, 9), (I, 10), (I, 11), (J, 8), (J, 9), (J, 10) and (K, 9) are connected respectively through inverters to an OR gate 176. The output terminals of said OR gates 175, 176 are connected to an OR gate 177, and the output terminals of the AND gate 174 and of the OR gate 177 are connected to an AND gate 178, of which the output signal corresponds to FG(U) shown in the equation (2).

Figure 9:
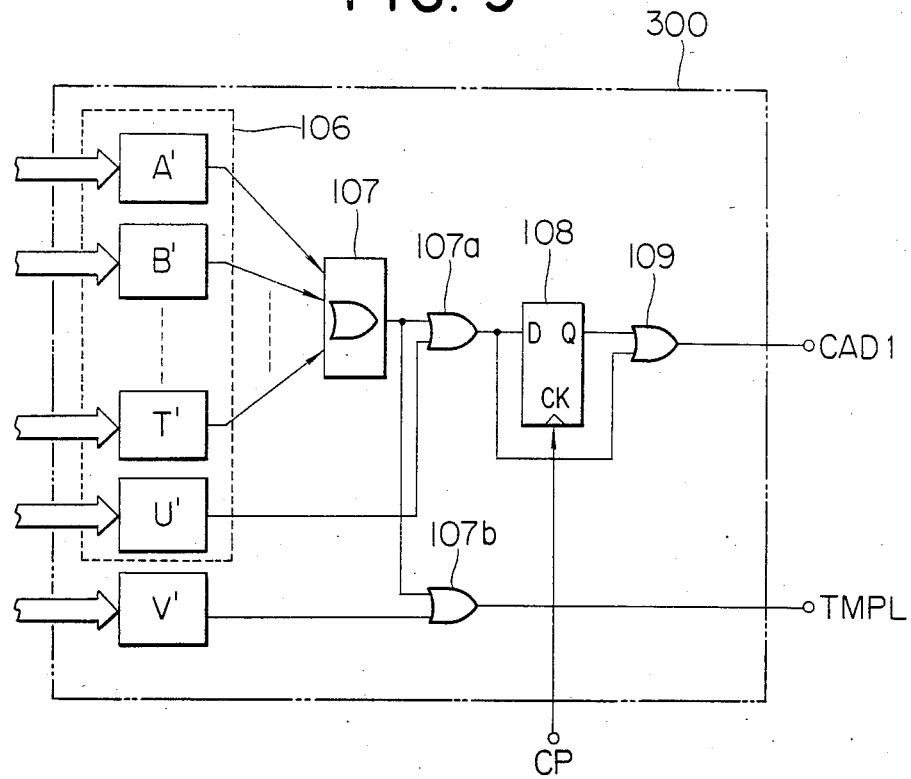
FIG. 9 is a detailed circuit diagram of a reference pattern detector.

FIG. 9 shows the circuit structure of the reference pattern detector 300 provided with 164 templates explained above. A matching circuit 106 comprises template circuit A'–U' constituting 164 templates, of which input terminals are connected to the determined bits of the aforementioned extracting circuit 103. The output terminals of the template circuits A'–T' are connected to an OR gate 107, and the output terminal of the template circuit U' is connected, together with the output terminal of the OR gate 107, to an OR gate 107a, of which the output terminal is connected to a D-type flip-flop 108. Said D-flip-flop 108 outputs, in synchronization with clock pulses CP from the control circuit 5, the output signals of the OR gate 107a with a delay equal to the interval of said clock pulses. An OR gate 109 outputs a signal CAD1 representing the logic sum of the output signal of D-flip-flop 108 and the output signal of the OR gate 107a. Thus, if the OR gate 107a starts to produce an output signal "1" in response to a clock pulse CP, the signal CAD1 is maintained at the level "1" at the entry of a succeeding clock pulse.

The detector 300 is also provided with a template circuit V' corresponding to the template V shown in FIG. 5V, in which a ring of 13×13 bits is positioned inside, by one pixel, the similar ring in the template U. Said template circuit V' is used in combination with the template circuits A'–T' for the comparative inspection to be explained later, and the template circuit U' is used in combination with said template circuits A'–T' for extracting characteristic information from the design data. The output signals of the template circuit V' and of the OR gate 107 are supplied to an OR gate 107b for producing an output signal TMPL. The reason for employing the template circuit V' in the comparative inspection will be explained later.

As explained above, the reference pattern detector 300 outputs, in addition to the signal TMPL indicating whether the pattern matches a template, the signal CAD1 which is equal to the output signal of the OR gate 107a but extended by a clock pulse. Said signal CAD1 is used for making distinction from the 90° angle information, at the preparation of the reference data (characteristic information) for the pattern comparison from the design data by means of the memory circuit 11. More specifically, the signal CAD1 from the detector 300 functions as one of the characteristic information extracted from the design data by the memory circuit 11, the other of said information being 90° angle information. On the other hand the signal TMPL is used in the actual comparative inspection of the reticle 1 as will be explained later.

As explained in the foregoing, the detector 300 detects an edge with a small stepping, an edge bent with an angle of 135° and a small isolated pattern, which often appear as a defect on or in the vicinity of an edge of the circuit pattern. For example, in case of forming a linear edge by connecting rectangular patterns as shown in FIG. 4, an eventual lack or an eventual addition of a rectangular pattern will result in the formation of a step. Such failure may occur, with a high probability, in case of drawing the circuit pattern on the reticle according to the design data. Also 90°-bends in the pattern edges formed on the reticle may be torn away with a similar high probability. In such case the 90°-bend is usually torn away diagonally with an angle of 45°, so that the bend which should originally be 90° appears as a bend of 135°. It is therefore rendered possible to detect the defects on the edges in the circuit pattern on the reticle, by the templates representing typical defects on the edge, such as a stepping form or a bend of 135°, occuring at a high probability. Also an isolated defect may occur with a high probability, by erroneous chromium deposition not corresponding to the design data, or by erroneous lack of chromium deposition in a place where the pattern should be present according to the design data. Such isolated defect can be exactly detected by the templates U, V for identifying such isolated patterns.

The detector 300 is used also in extracting the characteristic information from the design data, since a stepping form, for example, is added to the pattern edges for the convenience of designing. Consequently a stepping form or an angle of 135°, if found in the pattern edges observed by the ITV device 2, will not be regarded as a defect if it is originally included in the design.

Figure 10:
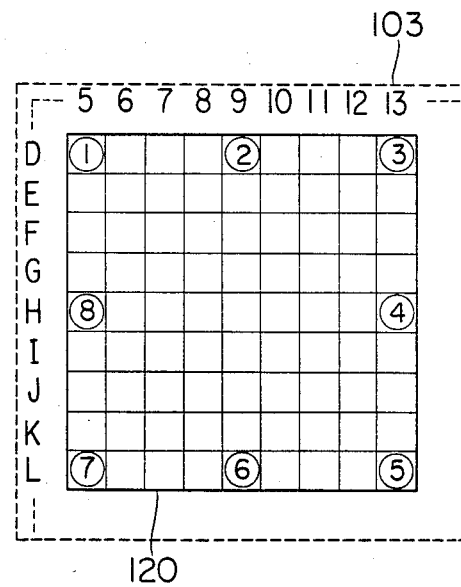
FIG. 10 is a view of a 9×9 rectangular area selected for edge detection.

For the purpose of detection with the edge detector 7 shown in FIG. 1, there is selected a rectangular area of 9×9 pixels as shown in FIG. 10, which is positioned at the approximate center of the aforementioned area of 16×16 pixels. Thus the edge detector 7 discriminates the presence of an edge, in response to the information from an area 120 of 9×9 bits in the extracting unit 103 of the extracting circuit 4 shown in FIG. 3.

A central bit or pixel of the area 120 is positioned at a bit (H, 9) in the area of 16×16 bits shown in FIGS. 5A–5V. For the purpose of edge detection there are employed eight bits (1)–(8) positioned at every four bits along the periphery of the area of 9×9 bits.

Figure 11:
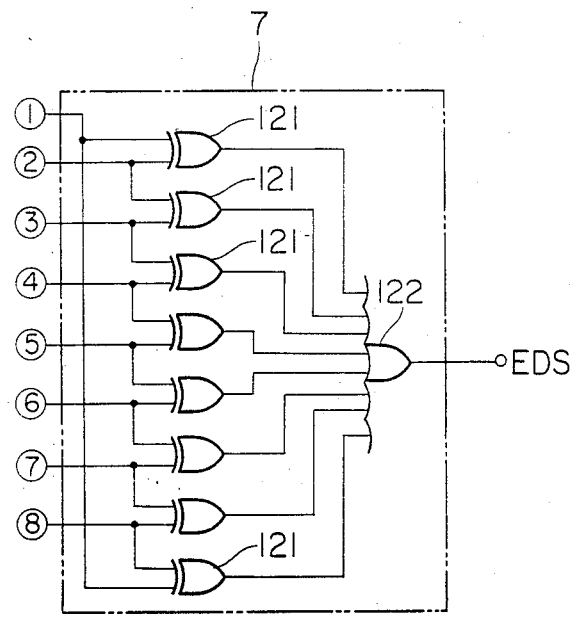
FIG. 11 is a circuit diagram of an edge detecting circuit.

FIG. 11 shows the circuit of said edge detector 7, in which eight exclusive-OR gates 121 receive binary signals from eight bits (1)–(8) along the periphery of the area 120. If at least one of the logic values from said eight bits is different, an OR gate 122 produce a level-"1" output signal EDS, indicating the presence of an edge. Each of said eight exclusive-OR gates 121 receives output signals of mutually neighboring two bits among the above-mentioned eight bits in the area 120 of 9×9 bits.

Figure 12:
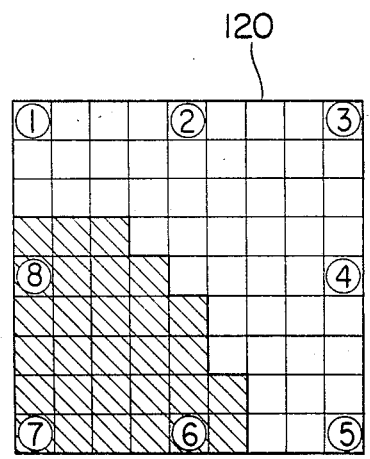
FIG. 12 is a view showing a pattern appearing in said 9×9 bit area.

Let us consider a case in which, as shown in FIG. 12, a pattern looking like an angle appears in the area 120, wherein the logic value "1" appears in the hatched area. In such case the input signals (5) and (6), or (1) and (8) to the edge detector 7 have mutually different logic values, thus shifting the signal EDS to "1". Also a simple linear edge present in the area 120 provides a signal EDS "1" in the similar manner.

The above-described edge detector 7 functions on real-time basis in the inspection of the reticle, in synchronization with the ITV device 2. For more accurate detection of the presence of a pattern edge in the area 120, it is also possible to receive binary signals from all the 32 bits on the periphery of the area of 9×9 bits and examining the state of said 32 bits in the aforementioned manner. In such method the pattern edge is identified as absent if said 32 bits have the same logic value, while the presence of an edge is identified if at least one of 32 bits has a different logic value.

Figure 13:
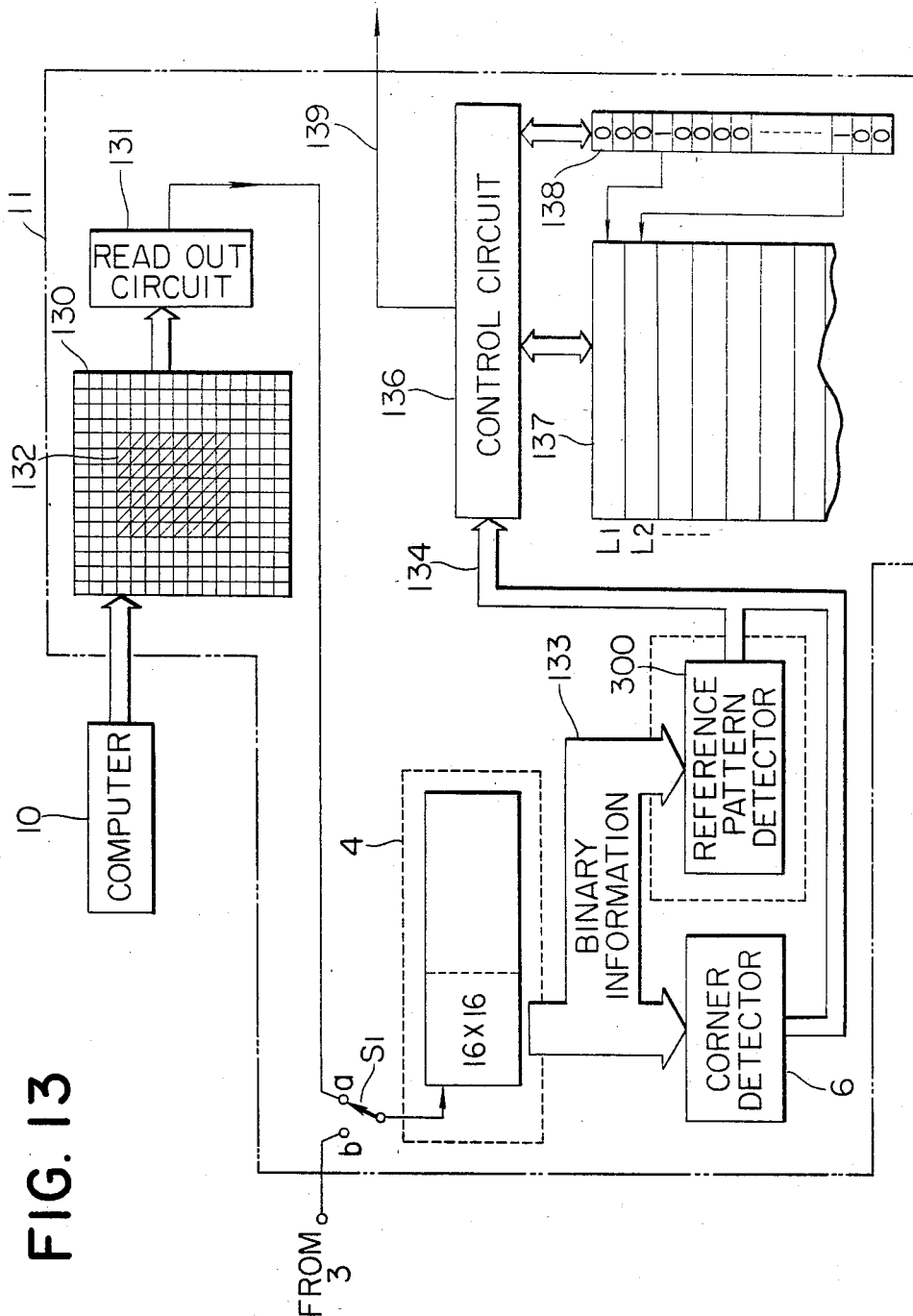
FIG. 13 is a detailed circuit diagram of a memory circuit.

Now reference is made to FIG. 13 showing the memory circuit 11 storing the characteristic information corresponding to the design data received from the magnetic tape shown in FIG. 1.

The memory circuit 11 is provided with a frame memory 130 of 1024×1024 bits for converting design data into a binary pattern corresponding to an image frame, and a readout circuit 131 for reading time-sequential binary signals from said frame memory 130 in the order of the scanning by the ITV device 2. A switch S1 is positioned at a terminal a or a terminal b respectively at a non-inspection mode or at an inspection mode. The terminal b receives binary image signals from the binary encoding circuit 3. The output signals from said readout circuit 131 are supplied, through the switch S1, to said extracting circuit 4 for obtaining binary information 133 of a local rectangular area in the frame memory 130. Said binary information 133 is supplied both to the reference pattern detector 300 and to a 90° corner detector 6 for generating 90° angle information. In practice said corner detector 6 synthesizes the signal CAD1 from the detector 300 with the 90° angle information to generate a signal CAD. In addition, if at least a reference pattern or a 90° corner is found in a scanning line of the frame memory 130 corresponding to a horizontal scanning line of the window 102, said corner detector 6 outputs a line flag signal indicating the present of characteristic information on said scanning line. Said signal CAD and said line flag signal are supplied, as indicated by an arrow 134, to an input/output control circuit 136. Said control circuit 136 stores the signal CAD in succession in a reference data memory 137, and the line flag signal in succession in a flag memory 138 in synchronization with the vertical scanning of the frame memory 130. The above-mentioned storage, or the preparation of the reference data, is effected while the inspection is not conducted. At the inspection, the switch S1 is connected to the terminal b whereby the extracting circuit 4 is connected to the detector 300 and to the aforementioned edge detector 7. Simultaneously the control circuit 136 outputs the data stored in the reference data memory 137 as a reference signal 139 in response to the flag signal stored in the flag memory 138.

The readout circuit 131, control circuit 136 and extracting circuit 4 function in synchronization with the clock pulses from the control circuit 5 shown in FIG. 1. The reference data memory 137 stores the characteristic information of the horizontal rows alone containing a reference pattern or a 90° corner in the frame memory 130, while the flag memory 138 has a number of bits the same as that in the vertical direction of the frame memory 130, i.e. 1024 bits in this case, and stores a signal "1" only in the horizontal row containing the characteristic information. These functions are all controlled by the control circuit 136.

Figure 14:
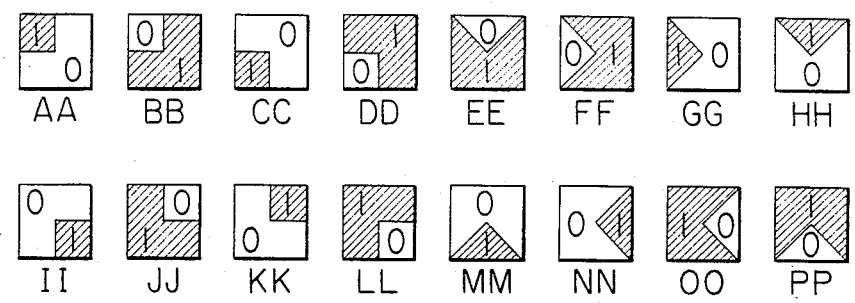
FIG. 14 is a view showing all the angles of 90° to be detected.
Figure 15:
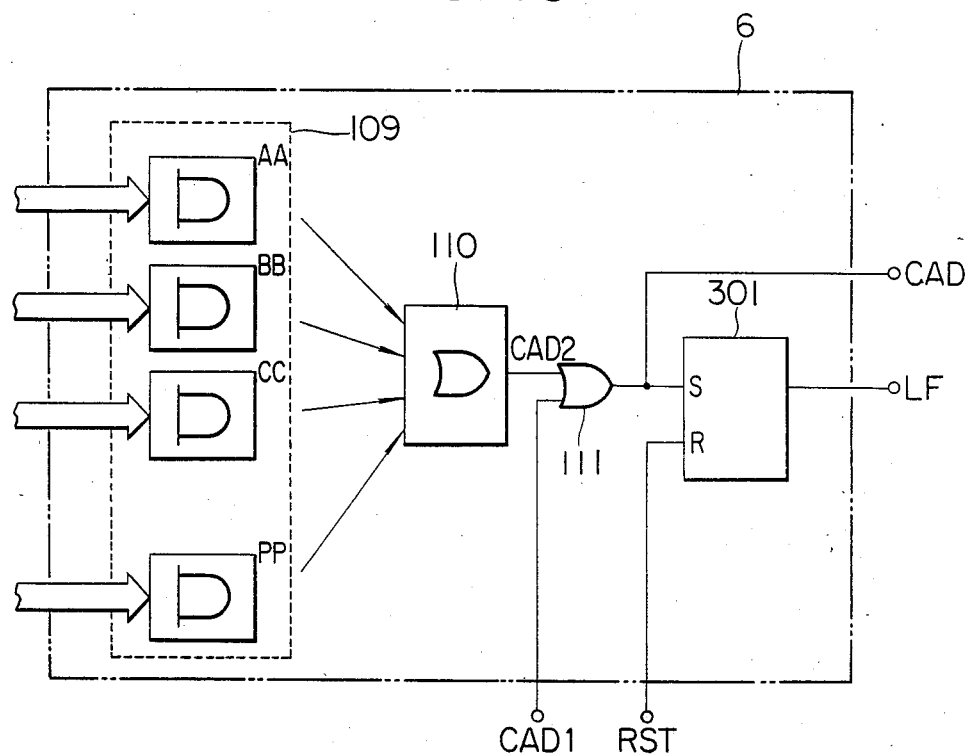
FIG. 15 is a detailed circuit diagram of an angle detecting circuit.

Now reference is made to FIGS. 14–16 showing the corner detector 6 of said memory circuit 11 in a more detailed manner.

FIG. 14 shows all the 90° corner patterns AA-PP to be detected, wherein each square area corresponds to the window 102 extracted by the extracting circuit 4. In each square the hatched area indicates the level "1" corresponding for example to a chromium plated area, while the white area indicates the level "0" corresponding for example to a glass surface area.

As shown in FIG. 15, the corner detector 6 is provided, in a matching circuit 109, with templates respectively corresponding to the above-explained 90° corner patterns AA-PP. The matching circuit 109 is provided with 16 AND gates respectively constituting said templates AA-PP. The output terminals of said 16 AND gates are respectively connected to the determined bits of the aforementioned extracting unit 103.

As an example, a template corresponding to the pattern BB in FIG. 14 can be obtained by connecting 11 bits in the extracting unit 103 to an AND gate. In each of said 16 templates for detecting a 90° corner, the corner is always positioned at a bit (H, 9) in the area of 16×16 bits, and the information of the neighboring bits (I, 9) and (H, 10) are also supplied to the AND gate. Consequently the bits (I, 9) and (H, 9) constitute a defining bit pair explained before, and the bits (H, 9) and (H, 10) also constitute a similar defining bit pair. In other templates the input bits to the AND gates are similarly determined according to the respective 90° corner patterns. The output signals from 16 AND gates in the matching circuit 109 are all supplied to an OR gate 110, of which output signal CAD2 is logically added, in an OR gate 111, to the signal CAD1 from the reference pattern detector 300 at a determined timing.

When the extracting unit 103 extracts the binary image in succession from the data in the frame memory 130, the signal CAD does not assume the level "1" continuously over two or more clock pulses.

In this manner the signal CAD is obtained as the characteristic information including both the signals CAD1 and CAD2, i.e. including both the reference pattern information and the 90° corner information. An R-S flip-flop 301 receives the signals CAD and RST and generates a line flag signal LF. Said R-S flip-flop 301 is reset by a signal RST to shift the signal LF to "0" immediately before the binary signals of a horizontal scanning line are outputted from the frame memory 130 by the readout circuit 131. Thereafter, when the signal CAD is shifted to "1" indicating a characteristic, said R-S flip-flip 301 is set to shift the signal LF from "0" to "1".

The corner detector 6 does not function in the actual comparative inspection of the reticle 1 but is needed only when the memory circuit 11 extracts the characteristic information from the design data for preparing the reference data.

Now reference is made to FIGS. 13, 17 and 18 for explaining the function of the reference data memory 137 and the flag memory 138 for storing the 90° corner information. As an example, it is assumed that a rectangular pattern 132, as indicated by a hatched area in FIG. 13, is formed in the frame memory 130.

In FIGS. 13 and 17, the binary information 133 extracted by the extracting circuit 4 corresponds to a rectangular area or window 140 in the frame memory 130. Said window 140 moves in the frame memory 130 in a direction indicated by an arrow to perform the scanning. The reference data memory 137 has a capacity of 512 bits for a horizontal scanning motion of the window 140. Said capacity of 512 bits will be hereinafter called a line memory. In case the window 140 horizontally scans in a position corresponding to the corners as illustrated, the signal CAD from the corner detector 6 is initially "0" since the 90° corner of the pattern 132 is not detected in the beginning, so that a signal "0" is stored in the initial part M1 of said line memory. Each bit in the line memory stores a binary signal in response to the scanning of every 2 bits of the window 140. Consequently, in the line memory the information is stored, by a compression of ½, of 1024 bits in the horizontal direction of the frame memory 130.

When the window 140 detects the upper left corner of the pattern 132 in the course of scanning, the signal CAD is shifted to "1" thereby storing a signal "1" indicating the presence of a corner, in a corresponding bit B1 of said line memory. When the corner is not detected, signals "0" are stored in a corresponding portion M2 of the line memory. Reference data of one line are thus prepared by the scanning of the window 140 in a line corresponding to the corners.

FIG. 18 shows the information stored in the reference data memory 137 and in the flag memory 138 corresponding to the binary pattern 132 present in the frame memory 130 as shown in FIG. 13. The pattern 132 has four 90° corners, corresponding to which the corner detector 6 shifts the signal LF to 37 1". As said corners are present only on two horizontal rows of the frame memory 130, the reference data memory 137 stores the reference data only in two line memories L1 and L2. On the other hand, the flag memory 138 stores flag data of 1024 bits, which are "1" only in 2 bits corresponding to two horizontal rows of the frame memory 130 and are "0" in other bits. In the foregoing explanation the reference data memory 137 and the flag memory 138 are assumed to store the data corresponding to an image frame of 1024×1024 bits, but, in practice, the reference data and the flag data corresponding to an image frame of the reticle are prepared from the design data and stored in the memory device of the aforementioned computer 10 prior to the inspection of the defects of the reticle by the image signals from the ITV device 2. Thus, in case of dividing the entire area of the reticle for example into 10×10=100 frames, there is required a memory capacity of 1024×100 bits for storing the flag data. On the other hand, there will be required, for storing the reference data, 512-bit line memories of a number corresponding to the number of the logic signals "1" in the flag memory 138. Therefore, if the flag memory 138 contains 1,000 signals "1" in its capacity of 1024×100 bits, there will be required a memory capacity of 512×1,000 bits for storing the reference data.

Figure 19:
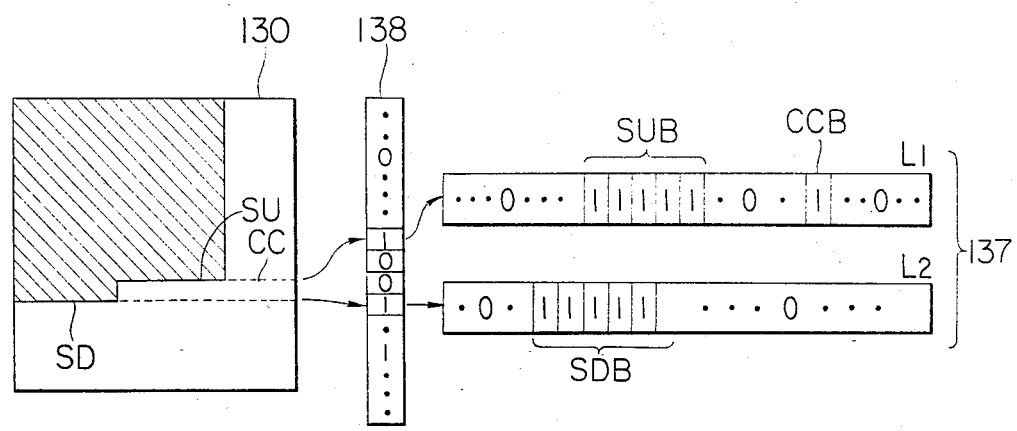
FIGS. 19 to 21 are views showing the function of a reference data memory and a flag memory corresponding to first, second and third patterns appearing in the frame memory.

As another example, FIG. 19 shows a pattern with a small stepping form in an edge, in the frame memory 130. It is assumed that horizontal edges SU, SD appear in the window 140 in the course of scanning operation within the frame memory 130 in the same manner as explained in relation to FIG. 17. For the purpose of explanation it is further assumed that said horizontal edges SU and SD are separated vertically by three pixels and are connected by a vertical edge. When said horizontal edge SU appears at a position equally bisecting the window 140, such pattern matches, among 164 templates of the detector 300, only to a template obtained by rotating by 180° and inverting the template A shown in FIG. 5A. The signal CAD1 assumes the level "1" because of the horizontal scanning of the window 140 as already explained in relation to FIG. 7. Since the defining bit pairs in said template are mutually separated by 4 pixels in the horizontal direction, the OR gate 107a of the detector 300 outputs the signals "1" over 4 clock pulses. Consequently the signal CAD1 assumes the level "1" for 5 bits, including the final addition of a bit "1". In this manner the line memory L1 of the reference data memory 137 stores 5 bits of level "1" signals in a portion SUB at the corresponding positions in the horizontal direction. A 90° corner CC appears in the window 140 in the subsequent horizontal movement thereof, and the corner detector 6 provides the signal CAD2 "1" for one bit. Consequently the line memory L1 stores the signal "1" in a bit CCB at a position corresponding to said corner CC, and the flag memory 138 stores a signal "1" in a corresponding bit according to the signal LF.

Then, when the window 140 reaches a horizontal scanning position lower by 3 pixels, the template A detects the stepping form composed of the horizontal edges SU, SD. Also in this case the signal CAD1 assumes the level "1" for 5 bits, so that the line memory L2 stores 5 bits of level "1" in a corresponding portion SDB, and the flag memory 138 stores a signal "1" in a corresponding bit.

In this manner, horizontal edges involving a stepping difference generate 2 bits of the signal "1" in the flag memory 138 and reference data in 2 line memories in the reference data memory 137.

In the absence of the reference pattern or the 90° corner in the window 140, the reference data memory 137 stores signals "0" in the aforementioned compressed form in a corresponding portion of the line memory.

Figure 20:
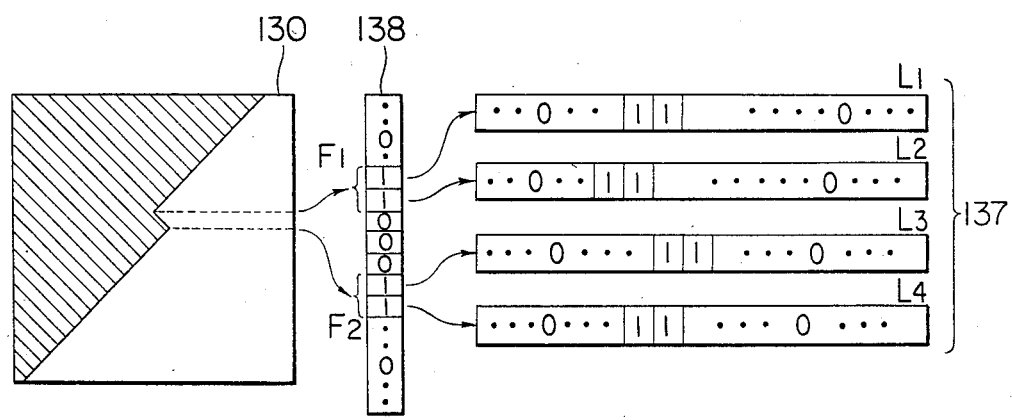

Then let us consider a case in which a 45° diagonal edge involving a small step of 90° appears in the frame memory 130 as shown in FIG. 20. The hatched area indicates a chromium plated area. For the purpose of explanation, said step is assumed to be in the order of 2 pixels in a direction of 135°. In the course of the scanning operation of the window 140 within the frame memory 130, said stepping form in the diagonal edge is detected by the template I shown in FIG. 5I and a template obtained by rotating by 180° and inverting said template I. The detections by said two templates take place at only one clock pulse in the horizontal scanning of the window 140, and the timing of said detection is vertically aberrated by one bit between two adjacent horizontal scanning lines. Consequently the flag memory 138 stores, at each of two positions F1, F2, the signals "1" in two neighboring bits. On the other hand, the reference data memory 137 stores reference data in four line memories L1, L2, L3 and L4. Each line memory stores the signal "1" in 2 bits in the horizontal direction according to the signal CAD1 of the detector 300, or to the signal CAD, and the positions of said signals "1" in the memories L1, L2, L3 and L4 are vertically aberrated as shown in FIG. 20.

Figure 21:
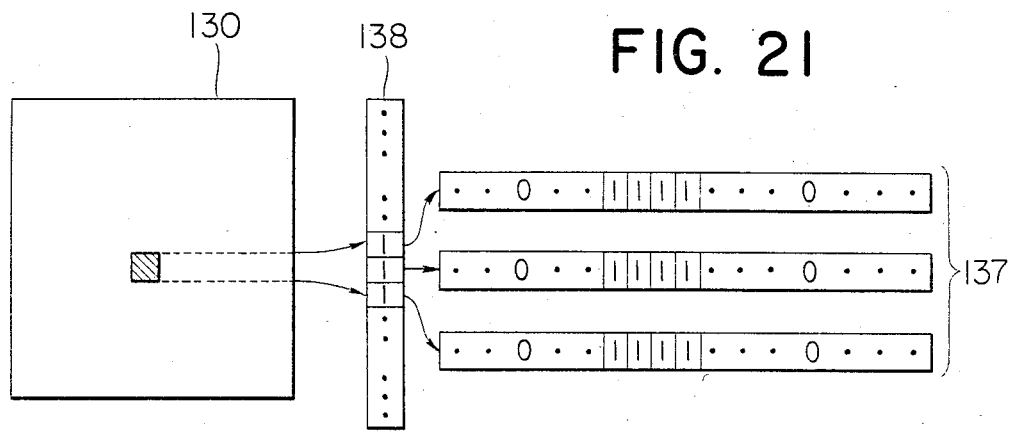
Figure 22:
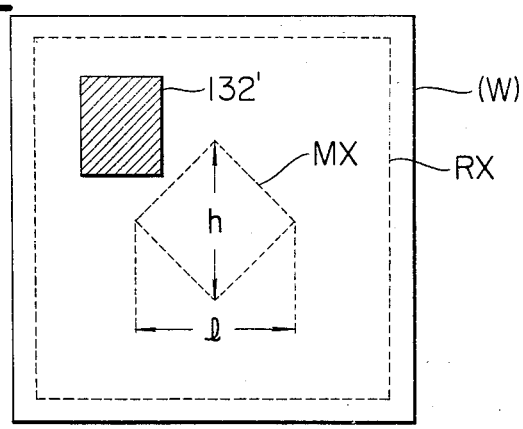
FIG. 22 is a view showing the detection of an isolated black pattern with a template.

Then let us consider a case of the presence of a small black pattern isolated in a white background in the frame memory 130 as shown in FIG. 21. Such isolated pattern is detected by a template $\overline{U}$ obtained by inverting the template U shown in FIG. 5U. The template $\overline{U}$ has a group of bits "1" in the central rectangular area. Thus, when said isolated pattern overlaps with at least a bit of said central rectangular area of the template $\overline{U}$ in the course of the scanning operation of the window 140, the reference data memory 137 stores the signals "1" in the bits corresponding to the position of said isolated pattern and in for example three line memories L1, L2 and L3. Simultaneously the flag memory 138 stores the signals 37 1" in consecutive 3 bits. The number of bits of the signals "1" to be stored in the flag memory 138 in response to the detection of an isolated pattern varies with the dimension of said pattern. More specifically the number of bits of the flag data increases for a smaller isolated pattern, and vice versa. The same applies to each line memory in the reference data memory 137. This fact will be explained further in FIG. 22, indicating the detection of a black isolated pattern 132' with the template U, including a central rectangular area MX and a ring-form area RX of $13 \times 13$ bits surrounding said rectangular area. As shown in FIG. 5U, the area MX has a size of 7 bits in the vertical direction h and in the horizontal direction 1. If the isolated pattern 132' has a size of one pixel, the signals "1" are recorded in seven consecutive bits in the flag data during the displacement of the isolated pattern 132' in the vertical direction in the area MX. In case the vertical size of the isolated pattern 132' is equal to or less than 4 pixels, signals "1" of 8 to 10 bits are recorded in the flag data. Also in case the vertical size of the isolated pattern 132' is equal to or in excess of 6 pixels, the number of bits of the signals "1" in the flag data becomes smaller than 7 bits because of the limitation by the ring-form area RX. Furthermore, in case the isolated pattern has a size of $12 \times 12$ pixels, the flag data will contain only one bit of the signal "1". In this manner the number of signals "1" varies according to the size of the isolated pattern 132'. The same situation applies to the reference data, so that the number of bits of consecutive signals "1" to be stored in a line memory in the reference data memory 137 is according to the horizontal size of the isolated pattern 132'. Also an isolated pattern 132' of a rectangular form of a sufficient size equal to or larger than $4 \times 4$ pixels as shown in FIG. 22 is also detected by the corner detecting template shown in FIG. 16. Consequently, in such case, the flag data contains 2 bits of the signal "1" corresponding to the corners of the isolated pattern, and the reference data are prepared corresponding to said flag data. Also the flag data and the reference data detected by the template $\overline{U}$ are positioned between the flag data obtained from the corner detecting template.

As explained in the foregoing, the reference data and the flag data are prepared in the reference data memory 137 and the flag memory 138 respectively according to the signals CAD and LF representing the characteristic information, corresponding to various patterns present in the frame memory 130. Since the binary image formed in the frame memory 130 corresponds to an image frame of the ITV device 2, the reference data and the flag data for an image frame of the reticle 1 are transferred, upon completion, to the memory device of the computer 10. Then similar data for a succeeding image frame of the reticle 1 are prepared and transferred to said memory device. In this manner the memory circuit 11 detects the characteristic information for the entire area of the reticle 1.

The characteristic information of the entire area of the reticle 1 are stored in the memory device, for example a magnetic disk, of the computer 10 when the inspection is not conducted. At the actual inspection, the characteristic information of an image frame of the reticle 1 are transferred, from said magnetic disk and through the computer 10, to the reference data memory 137 and to the flag memory 138 of the memory circuit 11.

At the inspection, a control circuit 136 outputs the data stored in the reference data memory 137 and in the flag memory 138 in succession as reference signals 139. Said reference signals 139 contain signals "0" of 512 bits if the corresponding bit in the flag memory 138 is "0", or the data of one line in the reference data memory 137 if said corresponding bit is "1".

Now there will be given an additional explanation on the templates U, V used in the detector 300 for detecting isolated patterns. The templates U, $\overline{U}$ are used in the preparation of the reference data from the design data, while the templates V, $\overline{V}$, smaller than said templates U, $\overline{U}$ are used in the comparative inspection. The template $\overline{V}$ is obtained by inverting black and white areas of the template V. Such use of templates is based on a fact that the pattern may become thinner in the comparative inspection because of a digitizing error in binary encoding the analog image signals obtained from the ITV device 2, and that the pattern itself to be inspected may show a thinning in the order of one pixel. As an example, let us consider a case that the design data contain a square isolated pattern of 14×14 pixels. The reference data are not prepared for such pattern because it cannot be detected by the template U or $\overline{U}$. In the comparative inspection, however, the size of said pattern may be reduced by 1 or 2 pixels because of a pattern thinning or of a digitizing error. Thus, if the template U is used for detecting the isolated pattern in the comparative inspection, said pattern may be erroneously detected as a defect since the detector 300 identifies said pattern as an isolated pattern, while the reference data do not contain a pattern flag indicating the presence of a reference pattern. In order to prevent such erroneous detection, the template V used for detecting the isolated pattern in the comparative inspection is made smaller than the template U.

Figure 23:
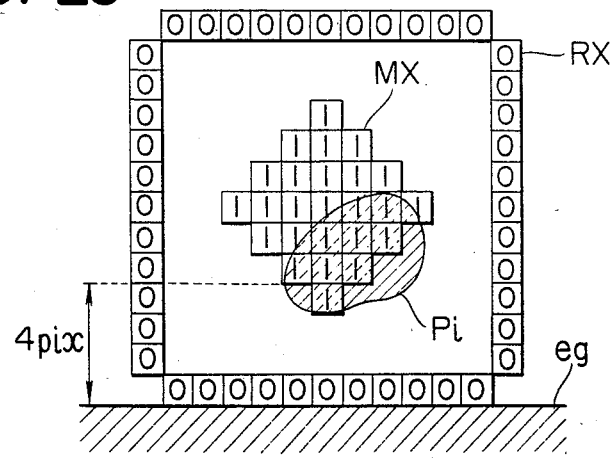
FIG. 23 is a view showing the detection of an isolated pattern at a distance of four pixels from a pattern edge with a template.
Figure 24:
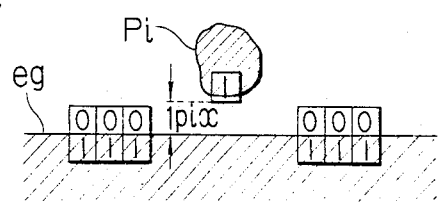
FIG. 24 is a view showing the detection of an isolated pattern at a distance of one pixel from a pattern edge with a template.
Figure 25:
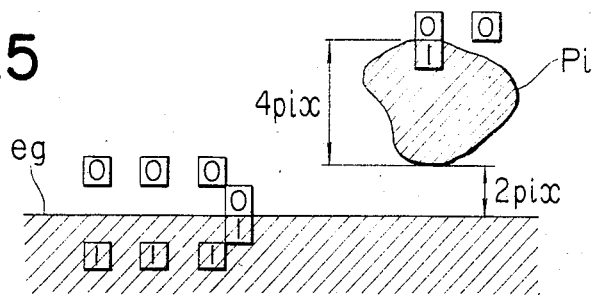
FIG. 25 is a view showing the detection of an isolated pattern at a distance of two pixels from a pattern edge with a template.

The reference pattern detector 300 is also capable of detecting an isolated pattern present close to a pattern edge. FIG. 23 shows the relationship between a black isolated pattern Pi present close to a pattern edge eg and the template V. In order to detect said isolated pattern Pi with the template V, said isolated pattern Pi has to be distanced from the edge eg by at least 4 pixels, since the edge eg interferes with the ring-form area RX if said distance is equal to or smaller than 3 pixels. Also the edge eg may not be linear but inevitably involves irregularities in the order of one pixel for example due to a digitizing error. Consequently, in order to ensure the detection with the template V, the isolated pattern has to be distanced from the edge eg by at least 5 pixels. The same applies to the template U, so that the isolated pattern has to be distanced by at least 6 pixels from the edge eg for ensuring detection. However, the isolated pattern Pi, if distanced by 5 pixels or less from the edge eg, may be detected by templates for detecting the stepping differences or the small flexions if the size of said isolated pattern is within a certain range. As an example, an isolated pattern Pi of a size of 2×2 pixels distanced by one pixel from a horizontal edge eg as shown in FIG. 24 can be detected by a template obtained by rotating by 90° and inverting the template S shown in FIG. 5S. Also an isolated pattern shown in FIG. 25, having a vertical size of 4 pixels and distanced by 2 pixels from a horizontal edge eg, can be detected by a template D shown in FIG. 5D. Said template D is designed for detecting a stepping difference of 6 pixels, but the detector 300 is also provided with other templates A, B, C for detecting the stepping differences of 3, 4 and 5 pixels. Consequently an isolated pattern similar to that shown in FIG. 25 but smaller in the vertical direction can always be detected by the template A, B or C.

In this manner the templates for detecting stepping differences or small flexions are effective for an isolated pattern not distanced by a determined number of pixels from a horizontal edge, and a template U or V is effective for an isolated pattern distanced by said determined number of pixels. Such complementary function of the templates of the reference pattern ensures secure detection of the isolated patterns, from those present close to the pattern edge to those distant from the pattern edge, thus significantly improving the accuracy of defect detection.

In the foregoing it is explained that the templates A-P are designed for detecting stepping differences, while the templates Q and R are designed for detecting angles of 135°, and the templates S and T are for detecting small flexions. In practice, however, the patterns detectable by these templates A-T cannot be exactly classified as explained above. For example, certain stepping forms in the pattern edge can also be detected by the templates S, T. Also the small flexions can be regarded as stepping forms. Therefore, the templates of the detector 300 can be classified into templates A-T constituting first detecting means for detecting pattern edges involving a stepping difference of a determined number of pixels, and templates U, V constituting second detecting means for detecting an isolated pattern.

Figure 26:
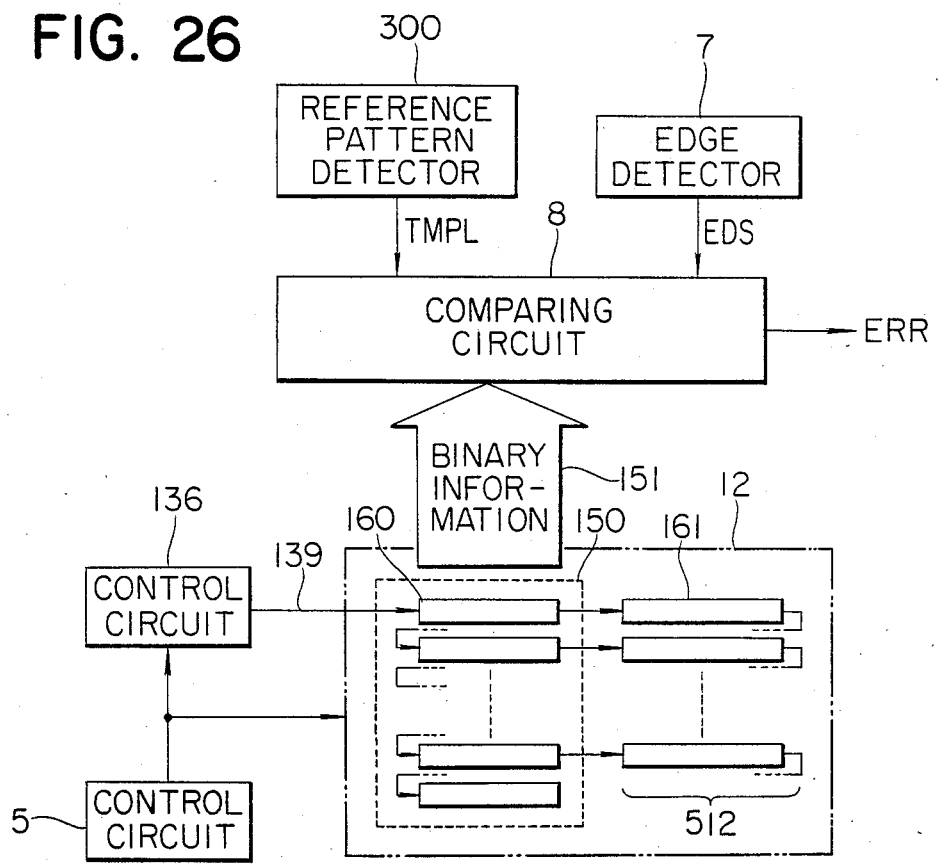
FIG. 26 is a view showing the function of an extracting circuit and a comparator circuit.

Now reference is made to FIG. 26 showing the extracting circuit 12 and the comparator circuit 8 shown in FIG. 1.

The extracting circuit 12 is composed of serially connected shift registers. A reference window 150 is composed of 9 units of 10-bit shift registers 160. A register 161 of 512 bits is connected to each 10-bit shift register 160. The reference signals 139 from the control circuit 136 are supplied to and transferred in said shift registers, bit by bit, in synchronization with the clock pulses from the control circuit 5. In practice said signals are shifted once by every two clock pulses. Binary information 151 of 10×9 bits in said reference window 150 are supplied to the comparator circuit 8.

Now there will be explained the function of the control circuit 136, extracting circuit 12 and comparator circuit 8.

Prior to the supply of a first clock pulse in a horizontal scanning line from the control circuit 5, the control circuit 136 discriminates the state of a bit in the flag memory 138 corresponding to said scanning line, and, if said bit is in a state "1", outputs the reference data of 512 bits corresponding to said scanning line from the reference data memory 137, at a rate of 1 bit per 2 clock pulses, as the reference signals 139. On the other hand, if said bit is in a state "0", signals "0" of 512 bits are outputted as the reference signals 139 at the same rate as explained above, during the horizontal scanning period of 1024 clock pulses. Signals thus obtained are transferred in succession in the serial shift registers. Also during the retrace period of the ITV device 2, signals "0" of 10 bits are generated as the reference signals 139 and shifted in the shift registers. In this manner the reference data in the reference data memory 138 are extracted in succession by the reference window 150 in response to the start of the scanning operation. At the start of inspection, the detector 300 and the edge detector 7 are also activated to supply the signals TMPL and EDS related to the pattern edges on the reticle 1, to the comparator circuit 8.

FIG. 27 shows an example of the characteristic information appearing in the reference window 150. Each bit position in the rectangular reference window 150 is represented by coordinate values (x, y). The rows at y=4 and y=8 are obtained from the reference data, while other rows, represented by ".", are selected as "0" because a corresponding bit in the flag memory 138 is "0".

As explained in the foregoing, the window 102 representing an image frame obtained from the pattern on the reticle 1, as shown in FIG. 2, moves in synchronization with the extracting operation of the extracting circuit 12. When an edge flexion a shown in FIG. 28 appears in the window 102, the detector 300 detects said flexion as a step between horizontal edges and outputs a signal TMPL "1", thereby setting a pattern flag. In response to said signal TMPL the comparator circuit 8 inspects the binary information 151 of the reference window 150 bit by bit from (x, y)=(1, 1) to (10, 9) to identify whether the signal "1" is present in consecutive two or more bits in the horizontal direction, i.e. whether a reference pattern is present in the design data. In case the signal "1" is either absent or present only in an isolated state, the comparator circuit 8 supplies defect information ERR indicating the presence of a defect to the computer 10. Also in case a torn part b formed by the breakage of a 90° corner appears in the window 102, the detector 300 identifies said part as an angle of 135° and outputs a signal TMPL "1". In such case the comparator circuit 8 examines the reference window 150 in the same manner to identify whether the design data contain the reference pattern. Also a small isolated pattern c in the window 102 is identified as an isolated pattern by the template V of the detector 300, whereby the signal TMPL is shifted to the level "1". Then the comparator circuit 8 examines the reference window 150 to identify the presence of a reference pattern in the design data. As an example, if the original pattern corresponding to the design data has a form as shown in FIG. 29A, the reference data at the lost portion b contain an isolated signal "1" indicating a 90° corner but do not contain signals corresponding to the edge flexion a or small isolated pattern c. Consequently the comparator circuit 8 generates defect information ERR corresponding to the positions of the defects a, b and c. Also in case the original pattern corresponding to the design data has a form shown in FIG. 29B, the reference data contain signals "1" in consecutive two or more bits corresponding to the positions a and c as the reference patterns, so that the comparator circuit 8 outputs the defect information ERR only corresponding to the defect b.

On the other hand, an isolated bit pattern "010" for example present in the positions (5, 4), (5, 5) and (5, 6) at the center of the reference window 150 indicates the presence of a 90° corner in the design data. In response to such bit pattern the comparator circuit 8 receives the signal EDS from the edge detector 7 shown in FIGS. 1 and 11 to discriminate the presence of an edge in a corresponding position on the reticle 1. If such corner is absent, defect information ERR is generated indicating that a 90° corner included in the design data is lost in the pattern formed on the reticle. Said comparator circuit 8 generates not only the defect information ERR indicating the presence or absence of defects but also the information concerning the positions of said defects, and such information can be easily obtained by counting the clock pulses from the control circuit 5. In this manner the comparator circuit 8 is capable, with a high accuracy, of detecting defects in the pattern, for example a 90° angle slightly rounded at the corner or a pattern edge involving slight flexions.

In the foregoing embodiments, the matching circuit of the reference pattern detector 300 is designed to extract binary signals of 11 bits from a template of 16×16 bits, for example the template A shown in FIG. 5A. As shown in FIG. 5A, the bits defining the edge position, for example the bits (G, 2) and (J, 2) or the bits (G, 6) and (J, 6) are mutually separated by a space of 2 bits. In general, a bit pattern obtained by binary encoding of an image of the ITV device or the like is unable to present a smooth linear edge but frequently involves flexions of an order of one or two pixels. The above-mentioned space is provided to cope with such flexions and to ensure the detection of the stepping difference.

Also the matching circuit 106 of the detector 300 shown in FIG. 9 is provided with 164 AND gates respectively corresponding to the templates, in order to identify which template matches the pattern. It is therefore possible to combine a certain number of templates in common if the matching template need not be identified, as will be explained in the following in relation to FIG. 30.

Figure 30:
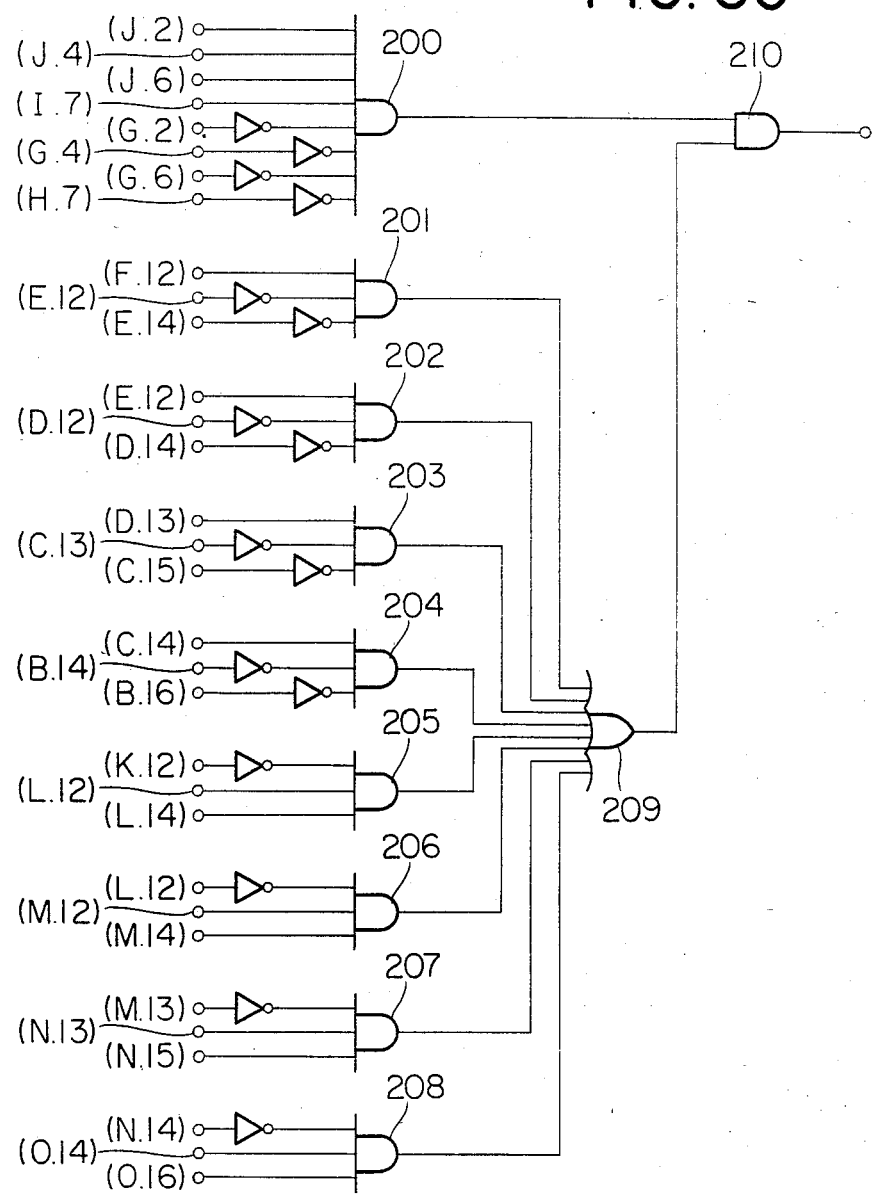
FIG. 30 is a diagram of an example of the circuit employable in the matching circuit shown in FIG. 9.

FIG. 30 shows a circuit capable of replacing the AND gates in the matching circuit 106 and constituting, as an example, eight templates A–H shown in FIGS. 5A–5H. It is to be noted that 8 bits (J, 2), (J, 4), (J, 6), (I, 7), (G, 2), (G, 4) (G, 6) and (H, 7) are common to all of said 8 templates. An AND gate 200 is therefore provided for detecting the pattern of said eight bits. Also for the bit patterns mutually different among eight templates A–H there are provided AND gates 201–208 which are connected to the different bits of the template as shown in FIG. 30. The output terminals of said AND gates 201–208 are connected to an 8-input OR gate 209, of which the output terminal is connected, together with the output terminal of the AND gate 200, to an AND gate 210. The output terminal of said AND gate 210 is connected to an input terminal of the OR gate 107 shown in FIG. 9.

In such circuit, in response to any of the edges shown by broken lines in FIGS. 4A–4H, the AND gate 200 outputs a signal "1" and simultaneously one of the AND gates 201–208 corresponding to the edge outputs a signal "1", whereby the OR gate 209 outputs a signal "1" which is transmitted through the AND gate 210. Consequently the detector 300 identifies that one of the templates A–H has matched the pattern and shifts the signals TMPL and CAD to the level "1".

As explained in the foregoing, the circuit shown in FIG. 30 makes it possible to extremely simplify the matching circuit 106 and to reduce the number of lines connecting the matching circuit 106 with the extracting circuit 4.

In the foregoing embodiment the detector 300 utilizes the signal CAD1 as shown in FIG. 9 in the preparation of the reference data from the design data, in order to distinguish the stepping forms in the edge, small flexions and isolated patterns from the 90° corner patterns. However such distinction is not essential. In case said distinction is not made, the addition of the final bit "1" in the signal CAD1 is eliminated in the preparation of the reference data from the design data. Also the inspecting algorithm of the comparator circuit 8 is simplified in such a manner that the defect information ERR is generated if the signals TMPL and EDS are both "0" when a bit "1" appears in the center of the reference window 150, that the defect is identified absent if either of said signals is at the level "1", and that the defect information ERR is generated if the reference window 150 contains no signal "1" when the signal TMPL assumes the level "1". The use of such algorithm makes it possible to further simplify the structure of the comparator circuit 8.

Figure 31:
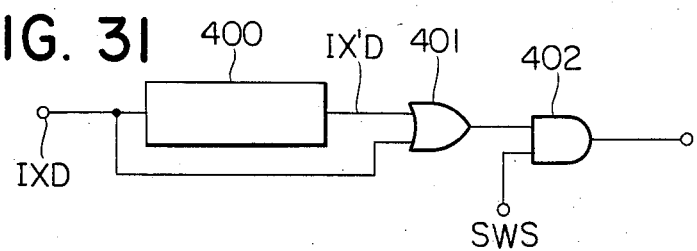
FIG. 31 is a diagram of a synthesizing circuit provided in the control circuit.

In the foregoing embodiment the reference data are stored in a memory of one line for each scanning line, but it is also possible to unite the data for two scanning lines into the memory of one line. A circuit shown in FIG. 31 can be incorporated for example in the control circuit 136 for synthesizing the reference data obtained from an even scanning line and from an odd scanning line. In said circuit, a delay unit 400 receives signals IXD of 512 bits obtained by compression of the characteristic information of 1024 bits from a horiozntal scanning line of the frame memory 130. Said delay unit 400 supplies, to a succeeding OR gate 401, signals IX'D obtained by delaying said signals IXD by 512 bits. The OR gate 401 calculates the logic sum of said signals IXD and IX'D and supplies said sum to an AND gate 402, which is controlled by a signal SWS of which the logic value varies according to the position of the horizontal scanning line in the frame memory 130. More specifically, said signal SWS assumes a level 37 1" or "0" respectively when an even scanning line or an odd scanning line is read in the frame memory 130.

Said synthesizing circuit synthesizes the signals IXD and IX'D and outputs the synthesized signals from an AND gate 402 when the signal SWS assumes the level "1". The output signals thus obtained are stored as reference data in one line of the reference data memory 137. In this manner it is rendered possible to reduce the memory capacity of said memory 137. Naturally the reference data memory 137 does not store any information if two horizontal scanning lines in the frame memory 130 contain no reference patterns nor 90° corners.

Also in the foregoing embodiment, a line memory in the reference data memory 137 contains five consecutive bits of signal "1" as shown in FIG. 19. It is however possible also to reduce the number of said bits to a half. Such reduction can be achieved by sampling the output signals of the OR gate 107a of the detector 300, with pulse signals of a frequency equal to a half of that of the clock signals from the control circuit 5. Then the signal CAD1 is obtained by adding "1" next to a bit "1" in the compressed signals. Thus, for example four consecutive bits "1" appearing from the OR gate 107a as shown in FIG. 19 are compressed in a half, so that the corresponding signal CAD is composed of three bits "1". Since the number of bits "1" can be reduced in this manner even in a line memory corresponding to a horizontal scanning line, the reference data memory 137 can record the stepping forms, small flexions and isolated patterns without error even when they appear in a large number within a horizontal scanning line. Although not specifically indicated in the drawings, the two-dimensional position of the stage 14 is constantly measured as coordinate values for example by an interferometer, and said coordinate values are supplied to the computer 10. Thus, at the start of actual inspection of the reticle 1 by the ITV device 2, the computer 10 controls the actuator 13 according to the coordinate values of the stage 14. Upon completion of comparative inspection for an image frame of the reticle 1, the stage 14 is so displaced that the ITV device 2 can image an adjacent image frame, and the strobe flash device 15 shown in FIG. 1 emits a flash to image the frame by the ITV device 2.

We claim:

1. An apparatus for inspecting a pattern consisting of bright parts and dark parts formed on a planar test speciment based upon design data, said apparatus comprising:
   an imaging means for scanning the pattern to generate binary signals according to the pattern;
   a first extracting means for serially extracting from the binary signal binary information corresponding to a determined area on the test specimen;
   a detecting means for generating a detection output upon detecting a specific shape in the determined area on the basis of the binary information, the specific shape having a boundary line between the bright parts and the dark parts of the pattern, the boundary line including a first line shorter than the width of the determined area and two parallel lines respectively extending from the ends of the first line, respectively, in opposite directions;
   a second extracting means for extracting information about the specific shape which the pattern is expected to have, from the design data with relation to the location of the determined area;
   an inspecting means for checking the detection output with the information extracted by the second extracting means.

2. An inspecting apparatus according to claim 1, wherein said imaging means includes means for generating an original image of said pattern and means for converting the original image into said binary signals.

3. An inspecting apparatus according to claim 2, wherein said imaging means has an imaging area including said determined area, and said second extracting means has memory means for storing the information relating to the specific shape corresponding to its location in the imaging area.

4. An inspecting apparatus according to claim 3, wherein said detecting means comprises:
   template means corresponding to a linear boundary line between the bright parts and the dark parts involving a stepping form of a determined number of pixels; and
   matching means for generating said detection output when the boundary line between the bright parts and the dark parts appearing in said determined area according to binary information extracted by said first extracting means coincides with said template means.

5. An inspecting apparatus according to claim 4, wherein said memory means comprises:
   a frame memory generating binary images indicating the bright and the dark parts of the image corresponding to said design data, in a form corresponding to the pixels of said original image;
   means for introducing signals read from said frame memory into said second extracting means.

6. An apparatus for inspecting a pattern consisting of bright parts and dark parts formed on a planar test specimen based upon design data, said apparatus comprising:
   an imaging means for scanning the pattern to generate binary signals according to the pattern;
   a first extracting means for serially extracting from the binary signals binary information corresponding to a determined area on the test specimen;

a detecting means for generating a detection output upon detecting a specific shape in the determined area on the basis of the binary information, the specific shape having an isolated portion of one of the bright parts and the dark parts smaller than the determined area and surrounded by the other of the bright parts and the dark parts;

a second extracting means for extracting information about the specific shape which the pattern is expected to have, from the design data with relation to the location of the determined area;

an inspecting means for checking the detection output with the information extracted by the second extracting means.

7. An inspecting apparatus according to claim 6 wherein said detecting means detects another specific shape having a boundary line between said bright parts and said dark parts, the boundary line including a first line shorter than the width of said determined area and two parallel lines extending from the ends of the first line respectively in opposite directions.

8. An inspecting apparatus according to claim 7, wherein said detecting means detects that one of the bright parts and the dark parts is absent within an area surrounding the isolated pattern and extending from the isolated pattern at a distance at least as long as the first line.

9. An inspecting apparatus according to claim 7 wherein said imaging means includes means for generating an original image of said pattern and means for converting the original image into said binary signals.

10. An inspecting apparatus according to claim 9, wherein said imaging means has an imaging area including said determined area, and said second extracting means has memory means for storing the information relating to the specific shape corresponding to its location in the imaging area.

* * * * *